US012122867B2

(12) United States Patent
Tai et al.

(10) Patent No.: US 12,122,867 B2
(45) Date of Patent: Oct. 22, 2024

(54) PHOTOCURABLE RESIN COMPOSITION AND USE THEREOF

(71) Applicant: ARISAWA MFG. CO., LTD., Joetsu (JP)

(72) Inventors: Makoto Tai, Joetsu (JP); Takashi Gondaira, Joetsu (JP)

(73) Assignee: ARISAWA MFG. CO., LTD., Joetsu (JP)

( * ) Notice: Subject to any disclaimer, the term of this patent is extended or adjusted under 35 U.S.C. 154(b) by 1107 days.

(21) Appl. No.: 16/964,738

(22) PCT Filed: Jan. 23, 2019

(86) PCT No.: PCT/JP2019/002126
§ 371 (c)(1),
(2) Date: Jul. 24, 2020

(87) PCT Pub. No.: WO2019/146657
PCT Pub. Date: Aug. 1, 2019

(65) Prior Publication Data
US 2020/0347177 A1 Nov. 5, 2020

(30) Foreign Application Priority Data

Jan. 26, 2018 (JP) ................................ 2018-012084
Feb. 15, 2018 (JP) ................................ 2018-025451
Oct. 1, 2018 (JP) ................................ 2018-186846

(51) Int. Cl.
| | | |
|---|---|---|
| *C08G 18/42* | (2006.01) | |
| *C08G 18/08* | (2006.01) | |
| *C08G 18/28* | (2006.01) | |
| *C08G 18/32* | (2006.01) | |
| *C08G 18/75* | (2006.01) | |
| *G03F 7/027* | (2006.01) | |
| *H05K 3/28* | (2006.01) | |

(52) U.S. Cl.
CPC ..... *C08G 18/4263* (2013.01); *C08G 18/0819* (2013.01); *C08G 18/281* (2013.01); *C08G 18/3221* (2013.01); *C08G 18/753* (2013.01); *G03F 7/027* (2013.01); *C08G 2170/00* (2013.01); *H05K 3/28* (2013.01)

(58) Field of Classification Search
CPC ............ C08G 18/4263; C08G 18/0819; C08G 18/281; C08G 18/3221; C08G 18/753; C08G 2170/00; C08G 18/0823; C08G 18/348; C08G 18/4238; C08G 18/44; C08G 18/6659; C08G 18/675; C08G 18/755; C08G 18/68; G03F 7/027; G03F 7/035; G03F 7/038; G03F 7/0388; G03F 7/004; H05K 3/28; H05K 1/0353; H05K 3/0023; H05K 2201/0145; H05K 1/0393; H05K 3/287; H05K 1/03; C09J 175/14; C09J 7/00; C09J 175/06; B32B 27/26; B32B 27/40; C09D 201/00; C09D 175/06; C09D 175/14
See application file for complete search history.

(56) References Cited

U.S. PATENT DOCUMENTS

| 4,753,860 A | 6/1988 | Hung et al. |
| 2004/0091632 A1* | 5/2004 | Matsunami .......... C09D 175/16 427/508 |

FOREIGN PATENT DOCUMENTS

| CN | 106560477 | 4/2017 |
| JP | 2009-185182 | 8/2009 |
| JP | 2009-230076 | 10/2009 |
| JP | 2010-002717 | 1/2010 |
| JP | 2010-164661 | 7/2010 |
| JP | 2011-028129 | 2/2011 |
| JP | 2012-083467 | 4/2012 |
| JP | 2014-214186 | 11/2014 |
| JP | 2017-066358 | 4/2017 |
| TW | 201529765 | 8/2015 |

OTHER PUBLICATIONS

Machine English translation of JP 2010-164661A (Year: 2010).*
International Search Report and Written Opinion issued for PCT/JP2019/002126, Mar. 12, 2019, 10 pages including English translation of the International Search Report.
Office Action issued for Taiwanese Patent Application No. 108102938, Apr. 29, 2022, 9 pages including English translation.
Office Action issued for the corresponding Japanese Patent Application No. 2019-545384, Oct. 20, 2020, 5 pages including machine translation.
Office Action issued for the corresponding Korean Patent Application No. 10-2020-7021310, Dec. 19, 2023, 5 pages including machine translation.

(Continued)

*Primary Examiner* — Jessica M Roswell
(74) *Attorney, Agent, or Firm* — HSML P.C.

(57) ABSTRACT

A photocurable resin composition according to the present invention contains an anionic-group-containing photosensitive resin comprising a photosensitive urethane resin, a photopolymerization initiator and a thermal curing agent, wherein the photosensitive urethane resin is produced by reacting a raw material mixture containing (A) a polyol having at least an ester bond and also having an unsaturated bond at least in the main chain thereof, (B) a compound having at least one active-hydrogen-containing group and at least one anionic group in the molecule thereof, (C) a polyisocyanate and (D) a compound having at least one active-hydrogen-containing group and an unsaturated bond group in the molecule thereof, and the photosensitive urethane resin has an ester bond and an unsaturated bond in the main chain in the same molecule, wherein at least one of a side chain and a terminal has an anionic group and a side chain has an unsaturated bond group.

17 Claims, No Drawings

(56) References Cited

OTHER PUBLICATIONS

Office Action issued for Chinese Application No. 201980010239.8, Feb. 1, 2024, 18 pages including machine translation.

* cited by examiner

PHOTOCURABLE RESIN COMPOSITION AND USE THEREOF

TECHNICAL FIELD

The present invention relates to a photocurable resin composition and applications thereof, more particularly to a photocurable resin composition suitable for use as a resin material such as an application of a semiconductor package and an application of a circuit board incorporated into an electronic device, and applications thereof.

BACKGROUND ART

A polyurethane resin is excellent in abrasion resistance, adhesiveness, flexibility, chemical resistance, and the like and also excellent in aptitude for various processing methods, and therefore is widely used as various coating agents, paints, binders such as inks, and films, sheets, and other molded bodies. Polyurethane resins suitable for respective applications have been proposed. The polyurethane resin is basically obtained by reacting a high molecular weight polyol component, an organic polyisocyanate component, and, if necessary, a chain extender component, and it is possible to produce a polyurethane-based resin having various physical properties depending on the kind and combination of these components.

For example, Patent Literature 1 proposes a polyurethane resin composition containing at least a polyurethane resin (A) and a radical polymerizable compound (B), the polyurethane resin (A) containing a polyester polyol (a) containing at least a specific repeating unit and a polyisocyanate (b) as constituent components, and it is shown that a coating film having high hardness can be obtained by the polyurethane resin composition.

CITATION LIST

Patent Literature

Patent Literature 1: JP-A-2017-66358

SUMMARY OF INVENTION

Technical Problem

In recent years, electronic devices such as mobile phones, video cameras, and notebook computers is being reduced in size and thickness. Therewith, in circuit boards represented by semiconductor package (PKG) substrates, flexible printed circuit (FPC) boards, rigid flex (RF) substrates, and the like, a demand for space saving is high, and not only adhesion, heat resistance, and the like which have been required in the related art, but also reduced thickness or bendability are demanded. Since bending is accompanied by assembly to space saving, the circuit board requires bendability (seam folding) with an effective flex radius R=0 or folding endurance (flexibility) capable of bending a plurality of times.

In a curable composition using a polyurethane resin having reduced elasticity, reflow heat resistance may be not sufficient and cannot be adapted to chip mounting, and rebound at the time of bending may be large even though a curable composition using a polyurethane resin having low softness (high hardness) can satisfy heat resistance, and a polyurethane resin in the related art cannot be adapted to particularly an electronic device application.

Therefore, an object of the present invention is to provide a photocurable resin composition which is cured by irradiation with energy rays and can form a cured film having excellent bendability and excellent heat resistance.

Solution to Problem

In order to solve the above problems, the gist of the present invention is as follows.
<1> A photocurable resin composition containing: an anionic group-containing photosensitive resin containing at least a photosensitive urethane resin; a photopolymerization initiator; and a thermal curing agent, wherein the photosensitive urethane resin is obtained by reacting a raw material mixture containing the following compounds (A) to (D), and the photosensitive urethane resin has: an ester bond and an unsaturated bond in a main chain in the same molecule; an anionic group in at least one of a side chain and ends; and an unsaturated bond group in the side chain.
  (A) A polyol having at least an ester bond and at least an unsaturated bond in the main chain
  (B) A compound having both at least one active hydrogen-containing group and at least one anionic group in the molecule
  (C) Polyisocyanate
  (D) A compound having both at least one active hydrogen-containing group and an unsaturated bond group in the molecule
<2> The photocurable resin composition according to the above <1>, wherein an amount of the unsaturated bond in the main chain of the compound (A) is 0.80 mmol/g or more, and an amount of the anionic group contained in the anionic group-containing photosensitive resin is 0.60 mmol/g or more.
<3> The photocurable resin composition according to the above <2>, wherein an amount of the unsaturated bond in the side chain of the anionic group-containing photosensitive resin is 0.70 to 0.90 mmol/g.
<4> The photocurable resin composition according to the above <2>, wherein an amount of the anionic group contained in the anionic group-containing photosensitive resin is 0.60 to 1.50 mmol/g.
<5> The photocurable resin composition according to any one of the above <1> to <4>, wherein an amount of the unsaturated bond in the main chain contained in the photosensitive urethane resin is 0.40 to 2.20 mmol/g.
<6> The photocurable resin composition according to any one of the above <1> to <5>, wherein the anionic group contained in the compound (B) is a carboxyl group.
<7> The photocurable resin composition according to the above <6>, wherein an amount of the carboxyl group contained in the photosensitive urethane resin is 0.60 to 1.50 mmol/g.
<8> The photocurable resin composition according to any one of the above <1> to <7>, wherein the photosensitive urethane resin has an acid value of 33 to 85 mg KOH/g.
<9> The photocurable resin composition according to any one of the above <1> to <8>, wherein the compound (A) is a polyol obtained by reacting at least (a) at least one of an unsaturated dibasic acid and a derivative thereof with (c) a polyhydric alcohol.
<10> The photocurable resin composition according to the above <9>, wherein the compound (A) is a polyol obtained by reacting further (b) at least one of a saturated dibasic acid and a derivative thereof.

<11> The photocurable resin composition according to any one of the above <1> to <10>, wherein the compound (B) is at least one compound selected from the group consisting of dimethylol butanoic acid and dimethylol propanoic acid.
<12> The photocurable resin composition according to any one of the above <1> to <11>, wherein the compound (D) is at least one compound selected from the group consisting of glycerin monoallyl ether, glycerin monoacrylate, and glycerin monomethacrylate.
<13> The photocurable resin composition according to any one of the above <1> to <12>, wherein the photosensitive urethane resin is obtained by reacting an isocyanate group (Y) of the compound (C) with total active hydrogen (X) of sum of compounds other than the compound (C) at an equivalent ratio X/Y=0.7 to 1.1.
<14> A cured film formed from the photocurable resin composition according to any one of the above <1> to <13>.
<15> An adhesive sheet formed from the photocurable resin composition according to any one of the above <1> to <13>.
<16> A photosensitive film formed from the photocurable resin composition according to any one of the above <1> to <13>.
<17> A printed wiring board in which the photosensitive film according to the above <16> is provided on a wiring pattern made of a conductive material.
<18> An image display device including the cured film according to the above <14>.

Advantageous Effects of Invention

The cured film formed from the photocurable resin composition of the present invention has adhesion and excellent bendability and heat resistance.

Therefore, the cured film can be suitably used as a resin material for a semiconductor package application or a circuit board application.

DESCRIPTION OF EMBODIMENTS

Hereinafter, modes for carrying out the present invention (hereinafter, referred to as "the present embodiment") will be described in detail. The present invention is not limited to the following embodiments, and various modifications can be performed within a scope of the gist of the present invention.

In the present description, "mass" is synonymous with "weight".

In the present description, a (meth)acrylate means an acrylate or a methacrylate, and a (poly)oxyethylene chain means an oxyethylene chain or a polyoxyethylene chain, and a (poly)oxypropylene chain means an oxypropylene chain or a polyoxypropylene chain, respectively.

The photocurable resin composition of the present embodiment contains an anionic group-containing photosensitive resin containing at least a photosensitive urethane resin, a photopolymerization initiator, and a thermal curing agent.

Hereinafter, each component will be described.
(Anionic Group-Containing Photosensitive Resin)
<Photosensitive Urethane Resin>

The photosensitive urethane resin used in the present embodiment is obtained by reacting a raw material mixture containing the following compounds (A) to (D), and has an ester bond and an unsaturated bond in a main chain in the same molecule, an anionic group in at least one of a side chain and an end, and an unsaturated bond group in the side chain.

(A) A polyol having at least an ester bond and at least an unsaturated bond in the main chain
(B) A compound having both at least one active hydrogen-containing group and at least one anionic group in the molecule
(C) Polyisocyanate
(D) A compound having both at least one active hydrogen-containing group and an unsaturated bond group in the molecule The photocurable resin composition containing a photosensitive urethane resin having an unsaturated bond in the main chain can improve flexibility of a film when cured by irradiation with energy rays, and can be three-dimensionally crosslinked, so that an obtained cured film can have flexibility, which can withstand 180° seam folding, while providing heat resistance.

<(A) Polyol having at least Ester Bond and at Least Unsaturated Bond in Main Chain>

A polyol having at least an ester bond and at least an unsaturated bond in the main chain as the compound (A) is a polyester polyol having an unsaturated bond in the main chain. The compound (A) may be used in one kind alone or in combination of two or more kinds.

The polyester polyol is obtained by reacting an acid component with a polyol component.

In the present invention, at least one of (a) an unsaturated dibasic acid and a derivative thereof are used as the acid component. By using at least one of the unsaturated dibasic acid and a derivative thereof, a photosensitive urethane resin having an unsaturated bond in the main chain can be obtained.

Examples of the unsaturated dibasic acid include maleic acid, fumaric acid, itaconic acid, dimer acid, and 4-cyclohexene-1,2-dicarboxylic acid. Examples of derivatives thereof include dimethyl maleate, dimethyl fumarate, dichloride maleate, maleic anhydride, and itaconic anhydride. Among these, maleic anhydride is preferred in view of availability. Only one kind of these may be used alone, or two or more kinds thereof may be used in combination.

At least one of (b) a saturated dibasic acid and a derivative thereof can be used as the acid component. Examples of the saturated dibasic acid include aliphatic dibasic acids such as adipic acid, azelaic acid, sebacic acid, and dodecane diacid, alicyclic dibasic acids such as cyclohexane dicarboxylic acid, and aromatic dibasic acids such as phthalic acid, isophthalic acid, terephthalic acid, and naphthalene dicarboxylic acid. Examples of derivatives thereof include acid anhydrides such as phthalic anhydride, dialkyl esters, and halides. Among these, C6 to C12 aliphatic dibasic acids are preferred in view of availability. Only one kind of these may be used alone, or two or more kinds thereof may be used in combination.

At least one of (a) the unsaturated dibasic acid and a derivative thereof can be used at 1 mol % to 100 mol %, preferably 10 mol % to 90 mol %, more preferably 25 mol % to 75 mol % with respect to the acid component (total dibasic acid) of the polyester polyol composition. If the use amount is less than 1 mol %, a degree of crosslinking at the time of curing may be low, and an effect on bendability may be insufficient.

Examples of the polyol component include (c) a polyhydric alcohol.

Examples of the polyhydric alcohol include: polyhydric alcohols such as ethylene glycol, 1,3-propanediol, 1,2-propanediol, 1,3-butanediol, 2-methyl-1,3-propanediol, 1,4-butanediol, 1,5-pentanediol, 1,6-hexanediol, neopentyl glycol, 3-methyl-1,5-pentanedial, diethylene glycol, triethylene glycol, polyethylene glycol, dipropylene glycol, polypropylene glycol, cyclohexane dimethanol, glycerin, tetrahydroxy ethyl isocyanurate, and pentaerythritol; dihydric phenols such as hydrogenated bisphenol A, bisphenol A, bisphenol F, and bisphenol S; and adducts of these and alkylene oxides represented by propylene oxide or ethylene oxide. Among these, C2 to C6 glycols are preferred in view of availability. Only one kind of these may be used alone, or two or more kinds thereof may be used in combination.

Reactive groups of the acid component and the polyol component are usually blended such that the reactive group of the polyol component increases, and a ratio of the reactive groups of the acid component (total dibasic acid) to the polyol component (polyhydric alcohol) can be used at the polyol component/the acid component=1 to 2 mol/mol, preferably 1.05 to 1.5 mol/mol, more preferably 1.1 to 1.4 mol/mol. When the polyol component/the acid component is less than 1 mol/mol, a molecular end of the polyester polyol has an acid structure and is not suitable for a urethanization reaction. When the polyol component/the acid component is larger than 2 mol/mol, sufficient strength cannot be obtained when the polyester polyol has a reduced molecular weight and is processed into a film shape or the like.

In the present embodiment, the polyester polyol of the compound (A) is preferably a polyol obtained by reacting at least one of at least (a) the unsaturated dibasic acid and a derivative thereof with (c) a polyhydric alcohol, more preferably a polyol containing at least one of (b) the saturated dibasic acid and a derivative thereof and obtained by reaction.

Synthesis of the polyester polyol is not particularly limited, and a method publicly known in the related art can be used. For example, the polyester polyol can be obtained by charging at least the compound (a) and the compound (c), preferably the compounds (a) to (c) into a reaction vessel and reacting at 100° C. to 240° C. for 3 to 20 hours by a usual method while condensation water or the like of a by-product is removed out of a reaction system. In order to accelerate the reaction, a catalyst such as tetrabutyl titanate, lead acetate, lead oxide, dibutyltin oxide, or the like can also be added. A suitable solvent can also be added for the reaction.

In the present embodiment, in order not to deteriorate storage stability of the compound (A), for example, a suitable polymerization inhibitor such as hydroquinone or methoquinone can be used.

In the present embodiment, an amount of the unsaturated bond in the main chain of the compound (A) is preferably 0.80 mmol/g or more. When the content of the unsaturated bond in the main chain of the compound (A) is 0.80 mmol/g or more, strength of the film increases, and sufficient bendability can be obtained. Regarding the unsaturated bond amount in the main chain of the compound (A), a lower limit is more preferably 0.85 mmol/g or more, and an upper limit is preferably 5.00 mmol/g or less, more preferably 4.00 mmol/g or less.

The unsaturated bond amount is calculated by (the number of moles of the unsaturated dibasic acid/a quantity (g) of the obtained compound (A) used in the compound (A)).

The number average molecular weight (Mn) of the compound (A) is preferably 500 to 50,000. It is preferred that softness and film-forming properties of the photosensitive urethane resin can be obtained since the number average molecular weight is 500 or more, and a suitable viscosity can be obtained when the number average molecular weight is 50,000 or less to form the photosensitive urethane resin, so that suitable handling can be performed at the time of processing. Regarding the number average molecular weight, a lower limit is preferably 700 or more, more preferably 1,000 or more, still more preferably 2,000 or more, and an upper limit is preferably 10,000 or less, more preferably 5,000 or less.

<(B) Compound having both at least one Active Hydrogen-Containing Group and at least One Anionic Group in Molecule>

The compound having both at least one active hydrogen-containing group and at least one anionic group in the molecule as the compound (B) is a component for introducing an anionic group into at least one of the side chain and the end of the photosensitive urethane resin.

The active hydrogen-containing group is a group that reacts with an isocyanate group of a compound (C) polyisocyanate, and the anionic group is a functional group that is attached to at least one of the side chain and the end when the photosensitive urethane resin is formed. Examples of the active hydrogen-containing group include a carboxyl group, a hydroxyl group, and an amino group. The active hydrogen-containing group is at least one group selected from the group consisting of these groups, preferably at least the hydroxyl group in the present embodiment. Examples of the anionic group include groups capable of generating anions such as a carboxyl group, a sulfonic acid group, and a phosphoric acid group. The anionic group is at least one group selected from the group consisting of these groups, preferably the carboxyl group. In the present embodiment, the anionic group plays a role of curing the resin by reacting with the thermal curing agent, and plays a role of dissolving the resin with alkali when used in a solder resist or the like under conditions of not reacting with the thermal curing agent. When the group acting as the active hydrogen-containing group is a carboxyl group and the group acting as the anionic group is also a carboxyl group, the compound (B) has at least two carboxyl groups.

A compound of a carboxylic acid-based, a sulfonic acid-based, a phosphoric acid-based, or the like can be used as the compound (B). The compound (B) has a function of improving an adhesion imparting effect to a substrate, an effect of imparting the film-forming properties, and coating film toughness.

Examples of the carboxylic acid-based compound (B) include dimethylol propanoic acid, dimethylol butanoic acid, and alkylene oxide low molar adducts (the number average molecular weight is less than 500) of these compounds or γ-caprolactone low molar adducts (the number average molecular weight is less than 500) of these compounds, half esters derived from acid anhydrides and glycerin, and compounds derived from a free radical reaction of a monomer containing an acid anhydride and an unsaturated group and a monomer containing a carboxyl group and an unsaturated group.

Examples of the sulfonic acid-based compound (B) include N,N-bis(2-hydroxyethyl)-2-aminoethane sulfonic acid.

A particularly preferred compound (B) is dimethylol butanoic acid due to ease of reaction and dimethylol propanoic acid due to availability.

Only one kind of these may be used alone, or two or more kinds thereof may be used in combination.

<(C) Polyisocyanate>

The polyisocyanate as the compound (C) can use any polyisocyanate used in synthesis of a polyurethane resin publicly known in the related art, and is not particularly limited. Aromatic diisocyanates such as toluene-2,4-diisocyanate, 4-methoxy-1,3-phenylene diisocyanate, 2,4-diisocyanate diphenyl ether, 4,4'-methylene bis(phenylene isocyanate) (MDI), 2,4'-methylene bis(phenylene isocyanate), tolylene diisocyanate (TDI), xylylene diisocyanate (XDI), and 1,5-naphthalene diisocyanate, aliphatic diisocyanates such as methylene diisocyanate and 1,6-hexane diisocyanate (HDI), alicyclic diisocyanates such as 1,4-cyclohexylene diisocyanate, 4,4'-methylene bis(cyclohexyl isocyanate), and isophorone diisocyanate (IPDI), and compounds obtained by reacting these isocyanate compounds with low molecular weight polyols or polyamines such that the end is an isocyanate group can be naturally used as preferred examples of the polyisocyanate. Only one kind of these may be used alone, or two or more kinds thereof may be used in combination.

<(D) Compound Having Both at Least One Active Hydrogen-Containing Group and Unsaturated Bond Group in Molecule>

The compound having both at least one active hydrogen-containing group and an unsaturated bond group in the molecule as the compound (D) is a component that causes curing when the photocurable resin composition is irradiated with energy rays. The unsaturated bond group in the compound (D) refers to a group that reacts by a radical generated when the photocurable resin composition is irradiated with energy rays.

The compound (D) is not particularly limited, and one or more kinds can be used from the known compound. Examples thereof include 2-hydroxyethyl acrylate, 2-hydroxypropyl acrylate, 4-hydroxybutyl acrylate. 2-hydroxyethyl methacrylate, glycerin monoallyl ether, trimethylol propane diallyl ether, pentaerythritol triallyl ether, glycerin monoacrylate, and glycerin monomethacrylate. A preferred compound is a compound having two hydroxyl groups, preferably glycerin monoallyl ether, glycerin monoacrylate, and glycerin monomethacrylate, particularly preferably glycerin monomethacrylate. Only one kind of these may be used alone, or two or more kinds thereof may be used in combination.

<Synthesis of Photosensitive Urethane Resin>

The photosensitive urethane resin of the present embodiment is obtained by reacting the compound (A) to the compound (I)) and, if necessary, a chain extender. Examples of the chain extender include polyhydric alcohols (ethylene glycol, 1,4-butanediol, hydroquinone diethylol ether, 2,3-butanediol, trimethylol propane, and glycerin) and polyvalent amities (4,4'-diamino diphenyl methane, ethylene diamine, tri ethanol amine, 3,3'-dichloro-4,4'-diamino diphenyl methane), one of these may be used alone, or two or more kinds thereof may be used in combination.

Regarding use amounts of the compound (A), the compound (B), and the compound (D), when the number of moles of each component is summed,
the compound (A) is 5 mol % to 40 mol %, preferably 10 mot % to 30 mol %,
the compound (B) is 20 mol % to 80 mol %, preferably 40 mol % to 60 mol %, and
the compound (D) is 10 mol % to 50 mol %, preferably 20 mol % to 40 mol %.

When the compound (C) uses an equivalent ratio of total active hydrogen (X) of components other than the compound (C), that is, the compound (A), the compound (B), and the compound (D) (the compound (A), the compound (B), the compound (D), and the chain extender when the chain extender is contained) to an isocyanate group (Y) of the compound (C) in an amount of X/Y=0.7 to 1.1, preferably 0.75 to 1.0.

When the compound (A) is less than 5 mol %, an amount of unsaturated bonds in the main chain of the photosensitive urethane resin derived from the compound (A) is reduced, and sufficient development resistance, bendability, heat resistance (specifically, solder heat resistance), and the like may not be obtained. On the other hand, when the compound (A) is more than 40 mol %, the amount of the compound (B) and the compound (I)) is small, and curability or developability may be insufficient.

When the compound (B) is less than 20 mol %, an acid value of the photosensitive urethane resin decreases, and alkali developability of the photocurable resin composition containing the photosensitive urethane resin may take time. On the other hand, when the compound (B) is more than 80 mol %, there are a large number of anionic groups, so that aggregation of molecules may be large, and film formability and the like may be adversely affected.

When the compound (I)) is less than 10 mol %, intermolecular crosslinking by energy ray curing (for example, UV curing) is not sufficiently performed, and a fine pattern may not be drawn. On the other hand, when the compound (D) is more than 50 mol %, intramolecular crosslinking progresses, so that the obtained film may be stiff, and bendability and the like may deteriorate.

When the equivalent ratio X/Y of a sum total of the total active hydrogen (X) of the compounds other than the compound (C) to the isocyanate group (Y) of the compound (C) is less than 0.7, a sufficient molecular weight may not be obtained, and a film having strength may not be obtained. On the other hand, when the equivalent ratio X/Y is larger than 1.1, the isocyanate group becomes excessive, so that a side reaction with an active hydrogen group not involved in polymerization may be caused, and gelation may occur during reaction or storage.

A method for synthesizing the photosensitive urethane resin of the present embodiment using the compounds (A) to (D) is not particularly limited, and a method publicly known in the related art can be used. For example, the compounds (A) to (D) are used in combination with the chain extender if necessary, charged into a reaction vessel by a one-shot method or multi-step method in a proportion that the equivalent ratio of the total active hydrogen (X) of the components (the compound (A), the compound (B), the compound (D), and the chain extender) other than the compound (C) to the isocyanate group (Y) of the compound (C) is X/Y=0.7 to 1.1, and reacted at usually 20° C. to 150° C., preferably 60° C. to 110° C. until the isocyanate group of the product disappears, thereby obtaining the photosensitive urethane resin.

In the present embodiment, a polyol other than the compound (A) may be contained as a polyol component as long as the effects of the present invention are not impaired. Examples of the polyol other than the compound (A) include a polyether polyol, a polycarbonate polyol, a polyester polyol having no unsaturated bond in the main chain, and a polyolefin polyol. The polyol other than the compound (A) is preferably used in a range of 10 mol % to 60 mol %, preferably 20 mol % to 50 mol % in all polyols since it is difficult to achieve both bendability and heat resistance when the content is too large.

In order to accelerate the reaction, a salt of metal and an organic or an inorganic acid such as dibutyltin laurate, dioctyltin laurate, lead octylate, tetrabutyl titanate, or a zirconium-based compound, an organic amine such as an organic metal derivative or triethylamine, and a diazabicycloundecene-based catalyst can be used.

If necessary, a suitable solvent can also be added for the reaction. A preferred solvent includes those that are inert to the isocyanate group or lower in activity than a reactive component. Examples thereof include a ketone-based solvent such as acetone, methyl ethyl ketone, or cyclohexanone, an aromatic hydrocarbon-based solvent such as toluene, xylene, or solvent naphtha, an aliphatic or alicyclic solvent such as hexane or cyclohexane, an ether-based solvent such as dioxane or tetrahydrofuran, an ester-based solvent such as ethyl acetate or dibasic acid ester, a glycol ether ester-based solvent such as propylene glycol monomethyl ether acetate, an amide-based solvent such as dimethylformamide or dimethylacetamide, and a lactam-based solvent such as N-methyl-2-pyrrolidone.

In the synthesis of the photosensitive urethane resin of the present embodiment, a reaction terminator may be used when an isocyanate group remains at the end of the polymer. Examples thereof include monoalcohols such as methanol, ethanol, n-propanol, isopropanol, and tert-butyl alcohol, monoamines such as monoethylatnine and diethylamine, and alkanolatnines such as monoethanolamine and diethanolamine.

If necessary, an additive can also be added. Examples thereof include a hindered phenol-based or a phosphite-based antioxidant, a hindered amine-based light stabilizer, a benzophenone-based or benzotriazole-based ultraviolet ray absorber, a hydrazine-based gas discoloration stabilizer, and a metal deactivator. Only one kind of these may be used alone, or two or more kinds thereof may be used in combination.

The number average molecular weight (GPC measurement, PMMA conversion) of the photosensitive urethane resin obtained in the present embodiment is preferably 2,000 to 500,000, more preferably 5,000 to 200,000. If the number average molecular weight is less than 2,000, tack may occur in the resin, and water resistance or heat resistance may be poor. On the other hand, when it the number average molecular weight is more than 500,000, solution viscosity of the resin of the present invention may be too high or a resin solid content may be too small to deteriorate coatability.

An amount of the unsaturated bond in the main chain contained in the photosensitive urethane resin obtained in the present embodiment is preferably 0.40 mmol/g to 2.20 mmol/g.

When the amount of the unsaturated bond in the main chain contained in the photosensitive urethane resin is 0.40 mmol/g or more, it is preferred that strength of the film can be increased to obtain sufficient bendability; when the amount is 2.20 mmol/g or less, suitable curing can be performed to obtain sufficient solder heat resistance.

The unsaturated bond amount is calculated by (the number of moles of unsaturated dibasic acid used in the total compound (A)/the quantity (g) of the photosensitive urethane resin obtained).

In the present embodiment, when the anionic group-containing photosensitive resin is only the photosensitive urethane resin, an amount of the anionic group contained in the photosensitive urethane resin is preferably 0.60 mmol/g or more. When the amount of the anionic group of the photosensitive urethane resin is 0.60 mmol/g or more, suitable curing can be performed to obtain sufficient solder heat resistance. An upper limit is preferably 1.50 mmol/g or less. When the amount of the anionic group of the photosensitive urethane resin is 1.50 mmol/g or less, aggregation of molecules can be prevented from becoming large to obtain a proper film. Regarding the amount of the anionic group of the photosensitive urethane resin, a lower limit is more preferably 0.62 mmol/g or more, and an upper limit is preferably 1.30 mmol/g or less. Specifically, when the anionic group is a carboxyl group, the amount of the carboxyl group in the photosensitive urethane resin is preferably 0.60 mmol/g to 1.50 mmol/g.

The amount of the anionic group (carboxyl group) in the above case is calculated by (the number of moles of the total compound (B) used/the quantity (g) of the obtained photosensitive urethane resin). Alternatively, an acid value of the obtained photosensitive urethane resin can be measured and derived by (the obtained acid value/the molecular weight of KOH).

The acid value of the photosensitive urethane resin in the above case is preferably 33 mg KOH/g to 85 mg KOH/g. When the acid value of the photosensitive urethane resin is 33 mg KOH/g or more, it is preferred that suitable curing can be performed to obtain sufficient solder heat resistance; when the acid value is 85 mg KOH/g or less, it is preferred that the aggregation of molecules can be prevented from becoming large to obtain a proper film.

The acid value of the resin can be measured based on a method described in HS K0070.

In the present embodiment, the photosensitive urethane resin is preferably used in a range of 50 to 100 parts by mass in a total of 100 parts by mass of the anionic group-containing photosensitive resin. Since 70 parts by mass or more of the photosensitive urethane resin are contained, the anionic group-containing photosensitive resin is flexible to withstand 180° seam folding. The photosensitive urethane resin is more preferably 75 parts by mass or more in the total of 100 parts by mass of the anionic group-containing photosensitive resin.

When a black pigment is used in the photocurable resin composition, the photosensitive urethane resin is preferably used in a range of 70 to 100 parts by mass in the total of 100 parts by mass of the anionic group-containing photosensitive resin. Since 70 parts by mass or more of the photosensitive urethane resin are contained, the anionic group-containing photosensitive resin is flexible to withstand 180° seam folding. In the above case, the photosensitive urethane resin is more preferably 75 parts by mass or more in the total of 100 parts by mass of the anionic group-containing photosensitive resin.

<Other Anionic Group-Containing Photosensitive Resins>

In the present embodiment, an acid-modified epoxy acrylate, an acid group-containing acrylic acrylate, and the like can be used as a polymer component other than the photosensitive urethane resin.

These can be commercially available. Examples of the acid-modified epoxy acrylate include "ZFR-1491H" (carboxylic acid-modified bisphenol F type epoxy acrylate), "ZAR-2001H" (carboxylic acid-modified bisphenol A type epoxy acrylate), "CCR-1171H" (carboxylic acid-modified cresol novolac type epoxy acrylate), and "ZCR-1798H" (carboxylic acid-modified biphenyl type epoxy acrylate) (all trade names) manufactured by Nippon Kayaku Co., Ltd. Examples of the acid group-containing acrylic acrylate include "(ACA)-Z250", "(ACA)-Z230AA", "(ACA)-Z251", and "(ACA)-Z320" (all trade names) manufactured by DAICEL-ALLNEX LTD.

The polymer component other than the photosensitive urethane resin is preferably 0 to 50 parts by mass or more in the total of 100 parts by mass of the anionic group-containing photosensitive resin. When the content of the polymer component other than the photosensitive urethane resin is more than 50 parts by mass, the flexibility may decrease, and therefore the content is preferably 50 parts by mass or less.

The polymer component other than the photosensitive urethane resin is more preferably 30 parts by mass or less in the total of 100 parts by mass of the anionic group-containing photosensitive resin.

When a black pigment is used in the photocurable resin composition, the polymer component other than the photosensitive urethane resin is preferably 0 to 30 parts by mass in the total of 100 parts by mass of the anionic group-containing photosensitive resin. When the content of the polymer component other than the photosensitive urethane resin is more than 30 parts by mass, the flexibility may decrease, and therefore the content is preferably 30 parts by mass or less. In the above case, regarding the polymer component other than the photosensitive urethane resin, a lower limit is more preferably 10 parts by mass or more, and an upper limit is more preferably 25 parts by mass or less in the total of 100 parts by mass of the anionic group-containing photosensitive resin.

The anionic group-containing photosensitive resin contains at least the photosensitive urethane resin, and contains at least one of an acid-modified epoxy acrylate and an acid group-containing acrylic acrylate as desired. That is, the anionic group-containing photosensitive resin refers to a case of including only the photosensitive urethane resin, or a case of including at least the photosensitive urethane resin and including one or both of the acid-modified epoxy acrylate and the acid group-containing acrylic acrylate.

In the present embodiment, the amount of the unsaturated bond group in the side chain of the anionic group-containing photosensitive resin is preferably 0.70 mmol/g to 0.90 mmol/g. When the amount of the unsaturated bond group in the side chain of the entire anionic group-containing photosensitive resin is 0.70 mmol/g or more, it is preferred that patterning properties are improved; when the amount is 0.90 mmol/g or less, it is preferred to have flexibility that can withstand 180° seam folding. The amount of the unsaturated bond in the side chain of the anionic group-containing photosensitive resin can be calculated from a sum of amounts of the unsaturated bond groups of respective resins.

The amount of the unsaturated bond group in the side chain of the photosensitive urethane resin can be calculated from (the number of moles of the unsaturated bond group used in the compound (D)/the quantity (g) of the photosensitive urethane resin obtained). The amount of the unsaturated bond group in the side chain of the polymer other than the photosensitive urethane resin can be calculated from a reciprocal number of a double bond equivalent (a catalog value of each maker).

In the present embodiment, an amount of the anionic group contained in the anionic group-containing photosensitive resin is preferably 0.60 mmol/g or more. When the amount of the anionic group of the anionic group-containing photosensitive resin is 0.60 mmol/g or more, suitable curing can be performed to obtain sufficient solder heat resistance. An upper limit is preferably 1.50 mmol/g or less. When the amount of the anionic group of the anionic group-containing photosensitive resin is 1.50 mmol/g or less, aggregation of molecules can be prevented from becoming large to obtain a proper film. Regarding the amount of the anionic group of the anionic group-containing photosensitive resin, a lower limit is more preferably 0.62 mmol/g or more, and an upper limit is preferably 1.30 mmol/g or less. Specifically, when the anionic group is a carboxyl group, the amount of the carboxyl group in the anionic group-containing photosensitive resin is preferably 0.60 mmol/g to 1.50 mmol/g.

Regarding the anionic group amount, an acid value of the obtained anionic group-containing photosensitive resin can be measured and derived by (the obtained acid value/the molecular weight of KOH).

The acid value of the anionic group-containing photosensitive resin is preferably 33 mg KOH/g to 85 mg KOH/g. When the acid value of the anionic group-containing photosensitive resin is 33 mg KOH/g or more, suitable curing can be performed to obtain sufficient solder heat resistance, and if the acid value is 85 mg KOH/g or less, it is preferred that the aggregation of molecules is suppressed and an appropriate coating is obtained.

The acid value of the resin can be measured based on a method described in JIS K0070.

(Photopolymerization Initiator)

Any photopolymerization initiator known in the related art can be used as the photopolymerization initiator. Specific representative examples thereof include bis(2,46-trimethylbenzoyl)-phenylphosphine oxide, 2,4,6-trimethylbenzoyldiphenylphosphine oxide, 1,2-octanedione, 1[4-(phenylthio) phenyl-, 2-(O-benzoyl oxime)], ethanone, 1-[9-ethyl-6-(2-methylbenzoyl)-9 H-carbazole3-yl]-, 1-(O-acetyl oxime), 2-benzyl-2-dimethylamino-1-(4-morpholinophenyl)-butanone-1,2-(dimethylamino)-2-[(4-methylphenyl) methyl]-1-[4-(4-morpholinyl) phenyl]1-butanone, benzoin, benzoin methyl ether, benzoin ethyl ether, benzoin isopropyl ether, benzoin-n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxy cyclohexyl phenyl ketone, 2methyl-1-[4-(methylthio) phenyl]-2-morpholino-propane-1-one, 4-(2-hydroxy ethoxy) phenyl-2-(hydroxy-2-propyl) ketone, benzophenone, p-phenylbenzophenone, 4,4'-diethylamino benzophenone, dichloro benzophenone, 2-methylanthraquinone, 2-ethylanthraquinone, 2-tertiary butyl anthraquinone, 2-aminoanthraquinone, 2-methyl thioxanthone, 2-ethyl thioxanthone, 2-chloro thioxanthone, 2,4-dimethyl thioxanthone, 2,4-diethyl thioxanthone, benzyl dimethyl ketal, acetophenone dimethyl ketal, p-dimethylamino benzoic acid ethyl ester, and thioxanthones. These can be used in one kind alone or in combination of two or more kinds.

Among these, bis(2,4,6-trimethylbenzoyl)-phenylphosphine oxide, 2,4,6-trimethylbenzoyl diphenylphosphine oxide, 2-benzyl-2-dimethylamino-1-(4-morpholinophenyl)-butanone-1,2-(dimethylamino)-2-[(4-methylphenyl) methyl]-1[4-(4-morpholinyl) phenyl]-1-butanone, and thioxanthone are preferably used in view of thick film curability.

A use amount of the photopolymerization initiator is preferably 2 to 20 parts by mass, more preferably 6 to 16 parts by mass with respect to 100 parts by mass of the anionic group-containing photosensitive resin. When a content of the photopolymerization initiator is less than 2 parts by mass with respect to 100 parts by mass of the anionic group-containing photosensitive resin, a photo curing reaction of the anionic group-containing photosensitive resin is difficult to proceed, and when the content is more than 20 parts by mass, curing is not improved for a percentage of an amount to be added, embrittlement of the cured film occurs, and a characteristic of adhesion may not appear.

(Thermal Curing Agent)

Examples of the thermal curing agent include epoxy resins, carbodiimides, and amino resins.

Examples of the epoxy resins include bisphenol type epoxy resins such as a bisphenol A type epoxy resin and a modified derivative of the bisphenol A type epoxy resin, a bisphenol F type epoxy resin, a bisphenol S type epoxy resin, novolac type epoxy resins such as a phenol novolac type epoxy resin and a cresol novolac type epoxy resin, modified derivatives of the novolac type epoxy resins, biphenyl type epoxy resins, and naphthalene ring-containing epoxy resins. The bisphenol type epoxy resins and the modified derivatives of the bisphenol type epoxy resins are preferred in view of adhesion, and the novolac type epoxy resins and the modified derivatives of the novolac type epoxy resins are preferred in view of heat resistance. An epoxy equivalent of the epoxy resin is preferably 100 g/eq to 700 g/eq, more preferably 150 g/eq to 500 g/eq.

Among the above, the thermal curing agent is preferably an epoxy resin in view of heat resistance and the like.

When the thermal curing agent is an epoxy resin, the use amount of the thermal curing agent is preferably used such that the epoxy equivalent is 0.9 to 1.2 equivalents (eq) with respect to the anionic group of the anionic group-containing photosensitive resin. When the epoxy equivalent is 0.9 eq or more with respect to the anionic group equivalent 1, the heat resistance can be improved, and when the epoxy equivalent is 1.2 eq or less, the heat resistance can be maintained without decreasing the bendability.

(Other Additives)

A desired additive can be added to the photocurable resin composition within a range that does not impair the effects of the present invention. Examples thereof include a colorant, a photopolymerizable compound, a flame retardant, a dispersant, a leveling agent, a defoaming agent, and other resins.

(Colorant)

Examples of the colorant used in the present embodiment include an organic pigment and an inorganic pigment.

Examples of the organic pigment include organic pigments based on isoindoline, phthalocyanine, quinacridone, benzimidazolone, dioxazine, indanthrene, perylene, azo, quinophthalone, anthraquinone, aniline, and cyanine.

Examples of the inorganic pigment include carbon black, titanium black, ultramarine blue, Prussian blue, yellow lead, zinc yellow, red lead, iron oxide red, zinc white, lead white, lithopone, and titanium dioxide.

These may be used in one kind alone or in combination of two or more kinds. Among them, it is preferred to use an organic pigment in view of insulating properties. Since such a colorant is contained, concealment and resolution of a shape of the pattern circuit can be controlled.

When the photocurable resin composition of the present embodiment is used as a resist material of the circuit board, when a black photosensitive film is required for the purpose of concealing the circuit or the like, a blackish pigment is preferably contained as the colorant.

Examples of the blackish pigment include titanium black, carbon black, carbon nanotubes, acetylene black, aniline black, perylene black, strontium titanate, chromium oxide, and cerium oxide. Among them, perylene black is preferred in view that both resolution and concealment are satisfied.

The colorant is preferably used as a dispersion. The dispersion can be prepared by adding a composition obtained by mixing the colorant and a dispersant in advance to an organic solvent (or vehicle) and dispersing the mixture. The vehicle refers to a portion of a medium in which a pigment is dispersed when the coating material is in a liquid state, and includes a portion (binder) that forms a coating film by binding to the pigment in a liquid state, and a component (organic solvent) for dissolving and diluting the pigment.

The colorant used in the present embodiment preferably has a number average particle diameter of 0.001 μm to 0.1 μm, and more preferably 0.01 μm to 0.08 μm in view of dispersion stability. Here, the "particle diameter" refers to a diameter when an electron micrograph image of a particle is a circle having the same area, and the "number average particle diameter" refers to an average value of 100 particle diameters determined for a large number of particles.

A use amount of the colorant is preferably 0.2 to 10 parts by mass with respect to 100 parts by mass of the anionic group-containing photosensitive resin. A lower limit is more preferably 0.5 part by mass or more, an upper limit is more preferably 7 parts by mass or less, and colorants other than a black pigment are preferably used in 3 parts by mass or less, more preferably 2 parts by mass or less.

A content of the black pigment when a black photosensitive film is produced is preferably 1 to 10 parts by mass, more preferably 3 to 7 parts by mass with respect to 100 parts by mass of the anionic group-containing photosensitive resin.

When the content of the colorant is too small, a problem tends to occur that a desired shape cannot be drawn (resolution is poor) by scattering of exposure light during pattern formation (or patterning); when the content of the colorant is too large, the exposure light does not reach the bottom of the film during photocuring, an uncured portion may occur inside the film, and the pattern formation may become poor (resolution may be poor) due to erosion of the cured film during etching. Therefore, the content of the colorant is preferably in the above range.

(Photopolymerizable Compound)

The photopolymerizable compound used in the present embodiment is not particularly limited as long as photo-crosslinking is possible, but a compound having an ethylenically unsaturated bond is preferably used. Examples of the compound having an ethylenically unsaturated bond in the molecule include a (meth)acrylate compound, a bisphenol A-based di(meth)acrylate compound, an epoxy acrylate compound, a modified epoxy acrylate compound, a fatty acid-modified epoxy acrylate compound, an amine-modified bisphenol A-based epoxy acrylate compound, a hydrogenated bisphenol A-based di(meth)acrylate compound, a di(meth)acrylate compound having a urethane bond in the molecule, a (meth)acrylate compound having a hydrophobic backbone in the molecule, a polyalkylene glycol di(meth) acrylate compound having both a (poly)oxyethylene chain and a (poly)oxypropylene chain in the molecule, a trimethylolpropane di(meth)acrylate compound, and a polyester acrylate compound. These can be used alone or in combination of two or more kinds.

Examples of the photopolymerizable compound preferably used in the present embodiment as commercially available ones include "EBECRYL-3708", "EBECRYL-1039", and "EBECRYL-230" (all trade names, manufactured by DAICEL-ALLNEX LTD.).

The use amount of the photopolymerizable compound is preferably 10 parts by mass or more, more preferably 20 parts by mass or more, still more preferably 30 parts by mass or more, and preferably 70 parts by mass or less, still more preferably 65 parts by mass or less, still more preferably 60 parts by mass or less with respect to 100 parts by mass of the anionic group-containing photosensitive resin. With respect to 100 parts by mass of the anionic group-containing photosensitive resin, when a content of the photopolymerizable compound is 10 parts by mass or more, a fine circuit pattern can be drawn since resolution at the time of producing a circuit board can be improved; when the content of the photopolymerizable compound is 70 parts by mass or less, the cured film preferably has flame retardancy and heat resistance.

(Flame Retardant)

Examples of the flame retardant include a phosphorus-based flame retardant and a metal hydroxide, and among them, the phosphorus-based flame retardant is preferred in view of flame retardancy. The phosphorus-based flame retardant is, for example, a compound containing at least one phosphorus element in the molecule, but is not particularly limited, and examples thereof include red phosphorus, a condensed phosphate ester compound, a cyclic organic phosphorus-based compound, a phosphazene-based compound, a phosphorus-containing (meth)acrylate-based compound, a phosphorus-containing epoxy-based compound, and a phosphorus-containing polyol-based compound, and a phosphorus-containing amine-based compound, ammonium polyphosphate, melamine phosphate, and a phosphinic acid metal salt. These may be used in one kind alone or in combination of two or more kinds.

A use amount of the flame retardant is preferably 20 parts by mass or more, more preferably 30 parts by mass or more, still more preferably 40 parts by mass or more, and preferably 100 parts by mass or less, still more preferably 80 parts by mass or less, still more preferably 60 parts by mass or less with respect to 100 parts by mass of the anionic group-containing photosensitive resin. When the content of the flame retardant is 40 parts by mass or more and 60 parts by mass or less with respect to 100 parts by mass of the anionic group-containing photosensitive resin, flame retardancy can be exhibited, and other characteristics are not affected. If the content is less than 20 parts by mass, flame retardancy may deteriorate.

The photocurable resin composition of the present embodiment can be produced in accordance with a method publicly known in the related art, but is not particularly limited. For example, the anionic group-containing photosensitive resin can be produced by sequentially mixing the photopolymerization initiator, the thermal curing agent, and any other components. In a mixing step when a filler, the flame retardant, and the like are mixed, mixing can be done by using a mixer such as a bead mill or a roll mill.

(Cured Film)

The photocurable resin composition of the present invention can be cured by irradiation with energy rays to obtain a cured film having a desired thickness.

When the photocurable resin composition is cured, the photocurable resin composition is formed into a desired shape, specifically, the photocurable resin composition is applied to a surface of a base material or the like to a predetermined dry thickness. The resin layer is formed and dried, and then irradiated with energy rays to perform curing. The energy rays are not particularly limited, active energy rays such as visible light rays, ultraviolet rays, X-rays, and electron rays can be used, but ultraviolet rays are preferably used in view that a curing reaction can be efficiently performed.

A light source from which ultraviolet rays (UV) are emitted can be used as a light source of ultraviolet rays. Examples of the light source of ultraviolet rays include a metal halide lamp, a high pressure mercury lamp, a xenon lamp, a mercury xenon lamp, a halogen lamp, a pulse xenon lamp, and an LED, A thickness of the cured film can be, for example, 5 μm to 100 μm, preferably a thickness of 10 μm to 50 μm for use as a material of an electronic device such as an image display device.

Other Applications

Examples of preferred applications of the photocurable resin composition include a cured film, an adhesive sheet, a cover lay, a prepreg, and a photosensitive film.

(Adhesive Sheet)

The adhesive sheet of the present embodiment includes a support and a photocurable resin composition layer formed on the support, and the photocurable resin composition layer contains the photocurable resin composition of the present embodiment. The adhesive sheet may have a protective film layer on a surface of the photocurable resin composition layer opposite to the support.

According to the adhesive sheet according to the present embodiment, for example, the adhesive sheet is provided between a plurality of adherend layers and cured, and then the adhesive sheet is excellent in flexibility and can adhere to a plurality of adherends. In addition, the adhesive sheet can be provided by being thermal laminated on one surface of the adherend and photocured to be used as a cover lay film to be described later.

A method for producing the adhesive sheet will be described below.

In the photocurable resin composition layer, the photocurable resin composition of the present embodiment is dissolved in solvent such as methanol, ethanol, acetone, methyl ethyl ketone, methyl cellosolve, ethyl cellosolve, toluene, N,N-dimethylformamide, and propylene glycol monomethyl ether, or a mixed solvent thereof, a solution having a solid content of about 30 to 70 mass % is obtained, and the photosensitive resin composition layer is preferably formed by coating such a solution on the support.

Examples of the support include a polyester such as polyethylene terephthalate, and a polymer film having heat resistance and solvent resistance such as polypropylene and polyethylene. A surface of the support on which the photocurable resin composition is coated is preferably subjected to a mold release treatment.

A thickness of the support can be appropriately selected from an application and a thickness of the photocurable resin composition layer.

The thickness of the photocurable resin composition layer varies depending on the application, but is preferably 5 to 100 μm, and more preferably 10 to 50 μm in terms of the thickness after drying in which the solvent is removed by heating and/or hot air blowing.

Examples of the protective film include a polyethylene film, a polypropylene film, and polyethylene terephthalate.

(Prepreg)

The prepreg of the present invention includes a base material and a photocurable resin composition with which the base material is impregnated. The prepreg may have a protective film layer on both surfaces of the prepreg.

According to the prepreg according to the present embodiment, for example, the prepreg is provided between a plurality of adherend layers and cured, and then the prepreg is excellent in flexibility and can adhere to the plurality of adherends.

The method for producing the prepreg is not particularly limited, for example, the prepreg can be obtained by impregnating the base material with varnish obtained by dissolving the above photocurable resin composition in an organic solvent. As the organic solvent, methyl ethyl ketone, acetone, methyl isobutyl ketone, 2-ethoxyethanol, toluene, methanol, ethanol, 2-methoxyethanol, or the like can be used. A mixed solvent obtained by appropriately mixing the above solvent may be used.

A porous sheet material can be used as the base material, but a fiber base material made of an organic fiber or an inorganic fiber, or a fiber base material in which the organic fiber and the inorganic fiber are combined is particularly preferred. As the fiber base material, a woven or non-woven fabric of a polyester fiber, an aramid fiber, a carbon fiber, a glass fiber, a fiber made of a liquid crystal polymer (LCP), or the like and a woven or non-woven fabric in which these fibers are combined can be used. In fields requiring insulation properties, the polyester fiber, the aramid fiber, the glass fiber, the fiber made of a liquid crystal polymer (LCP) are preferred, and in fields requiring dielectric properties, the fiber made of liquid crystal polymer (LCP) is preferred.

Impregnation of the base material is performed, for example, by immersing the base material in the varnish in which the photocurable resin composition is dissolved in a predetermined solvent. Thereafter, the base material impregnated with the varnish is heated to a predetermined temperature to remove the solvent, and the prepreg can be obtained by making the varnish semi-cured.

(Cover Lay)

The cover lay of the present invention includes a base material film having electrical insulation properties and a photocurable resin composition layer, and the photocurable resin composition layer contains the photocurable resin composition of the present embodiment. The cover lay may have a protective film layer on a surface of the photocurable resin composition layer opposite to the base material film.

According to the cover lay of the present invention, for example, the cover lay is provided on a circuit-forming surface of the adherend on which the circuit is formed, and then a surface of the circuit can be certainly covered with the photocurable resin composition by complete curing (the circuit is certainly covered by diffusing the resin to every corner) and protected.

A method for producing the cover lay will be described below.

In the photocurable resin composition layer, the photocurable resin composition of the present embodiment is dissolved in solvent such as methanol, ethanol, acetone, methyl ethyl ketone, methyl cellosolve, ethyl cellosolve, toluene, N,N-dimethylformamide, and propylene glycol monomethyl ether, or a mixed solvent thereof, a solution having a solid content of about 30 to 70 mass % is obtained, and such a solution is coated on the base material film and heated to a predetermined temperature to remove the solvent, thereby obtaining the cover lay.

Examples of the base material film include polyesters such as polyimide, polyamide, and polyethylene terephthalate, and a polymer film having heat resistance and solvent resistance such as a liquid crystal film.

A thickness of the base material film can be appropriately selected from an application and a thickness of the photocurable resin composition layer.

The thickness of the photocurable resin composition layer varies depending on the application, but is preferably 5 to 100 μm, and more preferably 10 to 50 μm in terms of the thickness after drying in which the solvent is removed by heating and/or hot air blowing.

Examples of the protective film include a polyethylene film, a polypropylene film, and polyethylene terephthalate. A surface of the protective film contacting the photocurable resin composition layer is preferably subjected to a mold release treatment.

(Photosensitive Film)

The photosensitive film of the present invention includes a support and a photocurable resin composition layer formed on the support, and the photocurable resin composition layer contains the photocurable resin composition of the present embodiment. The photocurable film may have a protective film layer on a surface of the photosensitive resin composition layer opposite to the support. An example of the application of the photosensitive film includes a solder resist film.

A method for producing the photosensitive film will be described below.

In the photocurable resin composition layer, the photocurable resin composition of the present embodiment is dissolved in solvent such as methanol, ethanol, acetone, methyl ethyl ketone, methyl cellosolve, ethyl cellosolve, toluene, N,N-dimethylformamide, and propylene glycol monomethyl ether, or a mixed solvent thereof, a solution having a solid content of about 30 to 70 mass % is obtained, and the photosensitive resin composition layer is preferably formed by coating such a solution on the support.

Examples of the support include a polyester such as polyethylene terephthalate, and a polymer film having heat resistance and solvent resistance such as polypropylene and polyethylene. A surface of the support on which the resin composition is coated is preferably subjected to a mold release treatment.

A thickness of the support can be appropriately selected from an application and a thickness of the photocurable resin composition layer.

The thickness of the photocurable resin composition layer varies depending on the application, but is preferably 5 to 100 μm, and more preferably 10 to 50 μm in terms of the thickness after drying in which the solvent is removed by heating and/or hot air blowing.

Examples of the protective film include a polyethylene film, a polypropylene film, and polyethylene terephthalate.

The photosensitive film of the present invention can be used for forming a resist pattern. The resist pattern can be produced by, for example, a production method including: a lamination step of laminating the photosensitive film on a circuit forming substrate; an exposure step of irradiating a predetermined portion of the photocurable resin composition layer with active rays to form a cured portion in the photocurable resin composition layer; a developing step of removing the photocurable resin composition layer other than the cured portion; and a thermal curing step of curing the photocurable resin composition layer of the cured portion by heating.

When the photosensitive film has a protective film, the production method includes a step of removing the protective film from the photosensitive film.

The circuit forming substrate includes an insulating layer, and a conductor layer (a layer made of conductive materials such as copper, copper-based alloys, silver, silver-based alloys, nickel, chromium, iron, and iron-based alloys such as stainless steel, preferably made of copper or copper-based alloys) formed on the insulating layer by an etching method or a printing method, and the photocurable resin composition layer of the photosensitive film is laminated on the conductor layer side of the circuit forming substrate in the lamination step.

Examples of a lamination method of the photosensitive film in the lamination step include a method of laminating by compressing the circuit forming substrate while heating the photocurable resin composition layer. In a case of lamination in this manner, the photosensitive resin composition layer is preferably laminated under reduced pressure in view of adhesion, trackability, and the like.

In the lamination step, the photocurable resin composition layer is preferably heated at a temperature of 30° C. or higher and lower than 80° C., a compression pressure is preferably about 0.1 MPa to 2.0 MPa, and an ambient atmospheric pressure is preferably 3 hPa or less.

In the exposure step, a predetermined portion of the photocurable resin composition layer is irradiated with active rays to form a cured portion. Examples of a method for forming the cured portion include a method of irradiation with the active rays in an image form via a negative or positive mask pattern called an artwork. Further, exposure by a direct drawing method without a mask pattern such as a laser direct imaging (LDI) method and a digital light processing (DLP) exposure method is also possible. At this time, when the support present on the photocurable resin composition layer is transparent, the active rays can be directly irradiated. When the support is opaque, the photocurable resin composition layer is irradiated with the active rays after the support is removed.

As a light source of the actinic rays, a known light source, for example, a light source that radiates ultraviolet effectively such as a carbon arc lamp, a mercury vapor arc lamp, an extra-high pressure mercury lamp, a high pressure mercury lamp, a xenon lamp, and a semiconductor laser can be used. Further, a light source that effectively radiates visible light of a photographic flood electric bulb, a solar lamp (a lamp that emits light close to sunlight), and the like can be used.

Next, when the support is present on the photocurable resin composition layer, the photocurable resin composition layer other than the curing portion is removed and developed by wet development, dry development, or the like in the development step after the support is removed to form the resist pattern.

In a case of wet development, the photosensitive resin composition layer can be developed by a known method such as spraying, swinging immersion, brushing, and scratching using a developer such as an aqueous alkaline solution. The developer is safe and stable, and preferably has good operability, for example, a dilute solution of sodium carbonate at 20° C. to 50° C. (1 to 5 mass % of aqueous solution) is used.

When the resist pattern obtained by the above forming method is used as, for example, the solder resist film of the flexible printed circuit, the thermal curing step is performed after the development step.

Examples of a heating method can include heating by an oven. Heating is preferably performed at a temperature of 80° C. or higher for 20 to 120 minutes.

(Printed Wiring Board)

According to the above method, a printed wiring board (including a flexible printed wiring board) in which a wiring pattern made of a conductive material and a cover lay layer or a solder resist layer are formed in this order on the insulating layer is obtained.

(Image Display Device)

The image display device of the present invention includes the printed wiring board of the present invention. The image display device of the present invention, for example, includes: a liquid crystal display substrate having a liquid crystal display unit on a surface of a liquid crystal panel display; a printed circuit board provided with a drive circuit of the liquid crystal display substrate; and a flexible printed circuit (FPC) for electrically connecting the liquid crystal display substrate with the printed circuit board, and the printed wiring board of the present invention is used as the FPC.

One surface of the liquid crystal display substrate forms a liquid crystal display unit by enclosing a liquid crystal for forming a display area composed of a large number of pixel arrays between two insulating substrates based on glass. The printed circuit board is a so-called control substrate on which a control IC driving and controlling a touch sensor module is mounted.

One end of the printed wiring board of the present invention adheres to the liquid crystal display substrate, the other end thereof adheres to the printed circuit board, and the liquid crystal display substrate and the printed circuit board are electrically connected by the printed wiring board of the present invention.

EXAMPLES

Hereinafter, the present invention will be described in more detail according to Examples and Comparative Examples, but the present invention is not limited to only the Examples. In the examples, "part" and "%" mean on a mass basis.

Synthesis Example 1: Synthesis of Photosensitive Urethane Resin (A)

Into a 2-liter flask equipped with a stirrer, a thermometer, and a condenser tube, 365 g of adipic acid, 245 g of maleic anhydride, and 661 g of 1,6-hexanediol were charged, heated to 130° C., then warmed to 210° C. for 4 hours, and reacted at 210° C. for an additional 2 hours. Meanwhile, 134 g of condensed water was taken out of the system. Thereafter, the system was cooled to 100° C., and 0.11 g of hydroquinone was added to obtain a polyester polyol (PE-1) having an unsaturated bond in the main chain.

In the main chain of the obtained polyester polyol (PE-1), an unsaturated bond amount was 2.20 mmol/g, and an OH value was 59.5 mg KOH/g.

Next, into a 5-liter flask equipped with a stirrer, a thermometer, and a condenser tube, 1000 g of the polyester polyol (PE-1), 170 g of glycerin monomethacrylate ("Blemmer (registered trademark) GLM" (article name) manufactured by NOF CORPORATION) (hereinafter, GMA), 275 g of dimethylol butanoic acid (hereinafter, DMBA), and 650 g of isophorone diisocyanate (hereinafter, IPDI) were charged, and 698 g of toluene was further charged to 100° C. such that a resin content in the reaction system was 75%. The reaction was performed at 100° C. until there was no NCO group, and then the system was diluted with 1397 g of methyl ethyl ketone (hereinafter, MEK) such that the resin content was 50% to obtain a target polyurethane resin solution (photosensitive urethane resin (A)).

The amount of the unsaturated bond in the main chain of the photosensitive urethane resin (A) is 1.05 mmol/g, and an amount of the anionic group (carboxyl group) is 0.89 mmol/g.

An acid value of the obtained photosensitive urethane resin (A) was 50 mg KOH/g when measured by JIS K0070.

Synthesis Example 2: Synthesis of Photosensitive Urethane Resin (B)

Into a 5-liter flask equipped with a stirrer, a thermometer, and a condenser tube, 1000 g of a polycarbonate diol "ETERNACOLL (registered trademark) UH-200" (product name) (hydroxyl value: 56.2 mg KOH/g), 160 g of GMA, 260 g of DMBA, and 614 g of IPDI were charged, and 678 g of toluene was further charged to 100° C. such that a resin content in the reaction system was 75%. The reaction was performed at 100° C. until there was no NCO group, and then the system was diluted with 1356 g of MEK such that the resin content was 50% to obtain a polyurethane resin solution (photosensitive urethane resin (B)).

The amount of the unsaturated bond in the main chain of the photosensitive urethane resin (B) is 0 mmol/g, and an amount of the anionic group (carboxyl group) is 0.86 mmol/g.

An acid value of the obtained photosensitive urethane resin (B) was 50 mg KOH/g when measured.

Synthesis Example 3: Synthesis of Photosensitive Urethane Resin (C)

Into a 2-liter flask equipped with a stirrer, a thermometer, and a condenser tube, 730 g of adipic acid and 661 g of 1,6-hexanediol were charged, heated to 130° C., then warmed to 210° C. for 4 hours, and reacted at 10° C. for an additional 2 hours. Meanwhile, 179 g of condensed water was taken out of the system. Thereafter, a polyester polyol (PE-2) was obtained by cooling the mixture to 100° C.

In the main chain of the obtained polyester polyol (PE-2), an unsaturated bond amount was 0 mmol/g, and an OH value was 57.1 mg KOH/g.

Next, into a 5-liter flask equipped with a stirrer, a thermometer, and a condenser tube, 1000 g of the polyester polyol (PE-2), 163 g of GMA, 264 g of DMBA, and 624 g of IPDI were charged, and 684 g of toluene was further charged to 100° C. such that a resin content in the reaction system was 75%. The reaction was performed at 100° C. until there was no NCO group, and then the system was diluted with 1367 g of MEK such that the resin content was 50% to obtain a polyurethane resin solution (photosensitive urethane resin (C)).

The amount of the unsaturated bond in the main chain of the photosensitive urethane resin (C) is 0 mmol/g, and an amount of the anionic group (carboxyl group) is 0.87 mmol/g.

An acid value of the obtained photosensitive urethane resin (C) was 50 mg KOH/g when measured.

Synthesis Example 4: Synthesis of Photosensitive Urethane Resin (D)

Into a 5-liter flask equipped with a stirrer, a thermometer, and a condenser tube, 1000 g of the polyester polyol (PE-1) obtained in the Synthesis Example 1, 42.4 g of GMA, 392 g of DMBA, and 650 g of IPDI were charged, and 695 g of toluene was further charged to 100° C. such that a resin content in the reaction system was 75%. The reaction was performed at 100° C. until there was no NCO group, and then the system was diluted with 1390 g of MEK such that the resin content was 50% to obtain a polyurethane resin solution (photosensitive urethane resin (D)).

The amount of the unsaturated bond in the main chain of the photosensitive urethane resin (D) is 1.06 mmol/g, and an amount of the anionic group (carboxyl group) is 1.27 mmol/g.

An acid value of the obtained photosensitive urethane resin (D) was 72 mg KOH/g when measured.

Synthesis Example 5: Synthesis of Photosensitive Urethane Resin (E)

Into a 5-liter flask equipped with a stirrer, a thermometer, and a condenser tube, 1000 g of the polyester polyol (PE-1) obtained in the Synthesis Example 1, 446 g of GMA, 20 g of DMBA, and 650 g of IPDI were charged, and 705 g of toluene was further charged to 100° C. such that a resin content in the reaction system was 75%. The reaction was performed at 100° C. until there was no NCO group, and then the system was diluted with 1411 g of MEK such that the resin content was 50% to obtain a polyurethane resin solution (photosensitive urethane resin (E)).

The amount of the unsaturated bond in the main chain of the photosensitive urethane resin (E) is 1.04 mmol/g, and an amount of the anionic group (carboxyl group) is 0.06 mmol/g.

An acid value of the obtained photosensitive urethane resin (E) was 4 mg KOH/g when measured.

Synthesis Example 6: Synthesis of Photosensitive Urethane Resin (F)

Into a 5-liter flask equipped with a stirrer, a thermometer, and a condenser tube, 800 g of the polyester polyol (PE-1) obtained in Synthesis Example 1, 200 g of a polycarbonate diol "ETERNACOLL (registered trademark) UH-200" (product name) (hydroxyl value 56.2 mg KOH/g), 168 g of GMA, 272 g of DMBA, and 643 g of IPDI were charged, and 694 g of toluene was further charged to 100° C. such that a resin content in the reaction system was 75%. The reaction was performed at 100° C. until there was no NCO group, and then the system was diluted with 1389 g of MFK such that the resin content was 50% to obtain a polyurethane resin solution (photosensitive urethane resin (F)).

The amount of the unsaturated bond in the main chain of the photosensitive urethane resin (F) is 0.85 mmol/g, and an amount of the anionic group (carboxyl group) is 0.88 mmol/g.

An acid value of the obtained photosensitive urethane resin (F) was 50 mg KOH/g when measured.

Synthesis Example 7: Synthesis of Photosensitive Urethane Resin (G)

Into a 5-liter flask equipped with a stirrer, a thermometer, and a condenser tube, 600 g of the polyester polyol (PE-1) obtained in Synthesis Example 1, 400 g of a polycarbonate diol "ETERNACOLL (registered trademark) UH-200" (product name) (hydroxyl value 56.2 mg KOH/g), 166 g of GMA, 269 g of DMBA, and 636 g of IPDI were charged, and 690 g of toluene was further charged to 100° C. such that a resin content in the reaction system was 75%. The reaction was performed at 100° C. until there was no NCO group, and then the system was diluted with 1381 g of MEK such that the resin content was 50% to obtain a polyurethane resin solution (photosensitive urethane resin (G)).

The amount of the unsaturated bond in the main chain of the photosensitive urethane resin is 0.64 mmol/g, and an amount of the anionic group (carboxyl group) is 0.88 mmol/g.

An acid value of the obtained photosensitive urethane resin (G) was 50 mg KOH/g when measured.

Synthesis Example 8: Synthesis of Photosensitive Urethane Resin (H)

Into a 5-liter flask equipped with a stirrer, a thermometer, and a condenser tube, 400 g of the polyester polyol (PE-1) obtained in Synthesis Example 1, 600 g of a polycarbonate diol "ETERNACOLL (registered trademark) UH-200" (product name) (hydroxyl value 56.2 mg KOH/g), 164 g of GMA, 266 g of DMBA, and 629 g of IPDI were charged, and 686 g of toluene was further charged to 100° C. such that a resin content in the reaction system was 75%. The reaction was performed at 100° C. until there was no NCO group, and then the system was diluted with 1372 g of MEK such that the resin content was 50% to obtain a polyurethane resin solution (photosensitive urethane resin (H)).

The amount of the unsaturated bond in the main chain of the photosensitive urethane resin (H) is 0.43 mmol/g, and an amount of the anionic group (carboxyl group) is 0.87 mmol/g.

An acid value of the obtained photosensitive urethane resin (H) was 50 mg KOH/g when measured.

Synthesis Example 9: Synthesis of Photosensitive Urethane Resin (I)

Into a 2-liter flask equipped with a stirrer, a thermometer, and a condenser tube, 438 g of adipic acid, 196 g of maleic anhydride, and 661 g of 1,6-hexanediol were charged, heated to 130° C., then warmed to 210° C. for 4 hours, and reacted at 210° C. for an additional 2 hours. Meanwhile, 143 g of condensed water was taken out of the system. Thereafter, the system was cooled to 100° C., and 0.11 g of hydroquinone was added to obtain a polyester polyol (PE-3) having an unsaturated bond in the main chain.

In the main chain of the obtained polyester polyol (PE-3), an unsaturated bond amount was 1.74 mmol/g, and an OH value was 59.5 mg KOH/g.

Next, into a 5-liter flask equipped with a stirrer, a thermometer, and a condenser tube, 1000 g of the polyester polyol (PE-3), 170 g of GMA, 271 g of DMBA, and 630 g of IPDI were charged, and 690 g of toluene was further charged to 100° C. such that a resin content in the reaction system was 75%. The reaction was performed at 100° C. until there was no NCO group, and then the system was diluted with 1381 g of MEK such that the resin content was 50% to obtain a polyurethane resin solution (photosensitive urethane resin (I)).

The amount of the unsaturated bond in the main chain of the photosensitive urethane resin (I) is 0.84 mmol/g, and an amount of the anionic group (carboxyl group) is 0.88 mmol/g.

An acid value of the obtained photosensitive urethane resin (I) was 50 mg KOH/g when measured.

Synthesis Example 10: Synthesis of Photosensitive Urethane Resin (J)

Into a 2-liter flask equipped with a stirrer, a thermometer, and a condenser tube, 511 g of adipic acid, 147 g of maleic anhydride, and 661 g of 1,6-hexanediol were charged, heated to 130° C., then warmed to 210° C. for 4 hours, and reacted at 210° C. for an additional 2 hours. Meanwhile, 152 g of condensed water was taken out of the system. Thereafter, the system was cooled to 100° C., and 0.11 g of hydroquinone was added to obtain a polyester polyol (PE-4) having an unsaturated bond in the main chain.

In the main chain of the obtained polyester polyol (PE-4), an unsaturated bond amount was 1.29 mmol/g, and an OH value was 59 mg KOH/g.

Next, into a 5-liter flask equipped with a stirrer, a thermometer, and a condenser tube, 1000 g of the polyester polyol (PE-4), 168 g of GMA, 265 g of DMBA, and 598 g of IPDI were charged, and 677 g of toluene was further charged to 100° C. such that a resin content in the reaction system was 75%. The reaction was performed at 100° C. until there was no NCO group, and then the system was diluted with 1354 g of MEK such that the resin content was 50% to obtain a polyurethane resin solution (photosensitive urethane resin (J)).

The amount of the unsaturated bond in the main chain of the photosensitive urethane resin (J) is 0.63 mmol/g, and an amount of the anionic group (carboxyl group) is 0.88 mmol/g.

An acid value of the obtained photosensitive urethane resin (J) was 50 mg KOH/g when measured.

Synthesis Example 11: Synthesis of Photosensitive Urethane Resin (K)

Into a 2-liter flask equipped with a stirrer, a thermometer, and a condenser tube, 584 g of adipic acid, 98 g of maleic anhydride, and 662 g of 1,6-hexanediol were charged, heated to 130° C., then warmed to 210° C. for 4 hours, and reacted at 210° C. for an additional 2 hours. Meanwhile, 161 g of condensed water was taken out of the system. Thereafter, the system was cooled to 100° C., and 0.11 g of hydroquinone was added to obtain a polyester polyol (PE-5) having an unsaturated bond in the main chain.

In the main chain of the obtained polyester polyol (PE-5), an unsaturated bond amount was 1.06 mmol/g, and an OH value was 59 mg KOH/g.

Next, into a 5-liter flask equipped with a stirrer, a thermometer, and a condenser tube, 1000 g of the polyester polyol (PE-5), 168 g of GMA, 265 g of DMBA, and 598 g of IPDI were charged, and 677 g of toluene was further charged to 100° C. such that a resin content in the reaction system was 75%. The reaction was performed at 100° C. until there was no NCO group, and then the system was diluted with 1354 g of MEK such that the resin content was 50% to obtain a polyurethane resin solution (photosensitive urethane resin (K)).

The amount of the unsaturated bond in the main chain of the photosensitive urethane resin (K) is 0.42 mmol/g, and an amount of the anionic group (carboxyl group) is 0.88 mmol/g.

An acid value of the obtained photosensitive urethane resin (K) was 50 mg KOH/g when measured.

Synthesis Example 12: Synthesis of Photosensitive Urethane Resin (L)

Into a 5-liter flask equipped with a stirrer, a thermometer, and a condenser tube, 1000 g of the polyester polyol (PE-1) obtained in the Synthesis Example 1, 246 g of GMA, 196 g of DMBA, and 640 g of IPDI were charged, and 694 g of toluene was further charged to 100° C. such that a resin content in the reaction system was 75%. The reaction was performed at 100° C. until there was no NCO group, and then the system was diluted with 1389 g of MEK such that the resin content was 50% to obtain a polyurethane resin solution (photosensitive urethane resin (L)).

The amount of the unsaturated bond in the main chain of the photosensitive urethane resin (L) is 1.06 mmol/g, and an amount of the anionic group (carboxyl group) is 0.64 mmol/g.

An acid value of the obtained photosensitive urethane resin (K) was 36 mg KOH/g when measured.

Synthesis Example 13: Synthesis of Photosensitive Urethane Resin (M)

Into a 5-liter flask equipped with a stirrer, a thermometer, and a condenser tube, 300 g of the polyester polyol (PE-1)

obtained in Synthesis Example 1, 700 g of a polycarbonate diol "ETERNACOLL (registered trademark) UH-200" (product name) (hydroxyl value 56.2 mg KOH/g), 163 g of GMA, 264 g of DMBA, and 625 g of IPDI were charged, and 684 g of toluene was further charged to 100° C. such that a resin content in the reaction system was 75%. The reaction was performed at 100° C. until there was no NCO group, and then the system was diluted with 1368 g of MEK such that the resin content was 50% to obtain a polyurethane resin solution (photosensitive urethane resin (M)).

The amount of the unsaturated bond in the main chain of the photosensitive urethane resin is 0.32 mmol/g, and an amount of the anionic group (carboxyl group) is 0.87 mmol/g.

An acid value of the obtained photosensitive urethane resin (M) was 50 mg KOH/g when measured.

Synthesis Example 14: Synthesis of Photosensitive Urethane Resin (N)

Into a 2-liter flask equipped with a stirrer, a thermometer, and a condenser tube, 620.5 g of adipic acid, 73.5 g of maleic anhydride, and 664 g of 1,6-hexanediol were charged, heated to 130° C., then warmed to 210° C. for 4 hours, and reacted at 210° C. for an additional 2 hours. Meanwhile, 166 g of condensed water was taken out of the system. Thereafter, the system was cooled to 100° C., and 0.11 g of hydroquinone was added to obtain a polyester polyol (PE-6) having an unsaturated bond in the main chain.

In the main chain of the obtained polyester polyol (PE-6), an unsaturated bond amount was 0.63 mmol/g, and an OH value was 59.5 mg KOH/g.

Next, into a 5-liter flask equipped with a stirrer, a thermometer, and a condenser tube, 1000 g of the polyester polyol (PE-6), 153 g of GMA, 255 g of DMBA, and 570 g of IPDI were charged, and 659 g of toluene was further charged to 100° C. such that a resin content in the reaction system was 75%. The reaction was performed at 100° C. until there was no NCO group, and then the system was diluted with 1319 g of MEK such that the resin content was 50% to obtain a polyurethane resin solution (photosensitive urethane resin (N)).

The amount of the unsaturated bond in the main chain of the photosensitive urethane resin (N) is 0.32 mmol/g, and an amount of the anionic group (carboxyl group) is 0.87 mmol/g.

An acid value of the obtained photosensitive urethane resin (N) was 50 mg KOH/g when measured.

Synthesis Example 15: Synthesis of Photosensitive Urethane Resin (O)

Into a 5-liter flask equipped with a stirrer, a thermometer, and a condenser tube, 1000 g of the polyester polyol (PE-1) obtained in the Synthesis Example 1, 272 g of GMA, 173 g of DMBA, and 656 g of IPDI were charged, and 700 g of toluene was further charged to 100° C. such that a resin content in the reaction system was 75%. The reaction was performed at 100° C. until there was no NCO group, and then the system was diluted with 1400 g of MEK such that the resin content was 50% to obtain a polyurethane resin solution (photosensitive urethane resin (O)).

The amount of the unsaturated bond in the main chain of the photosensitive urethane resin (O) is 1.05 mmol/g, and an amount of the anionic group (carboxyl group) is 0.56 mmol/g.

An acid value of the obtained photosensitive urethane resin (O) was 32 mg KOH/g when measured.

2. Evaluation of Physical Properties of Photocurable Resin Composition

Components were blended at blending ratios shown in Tables 1 to 4 and mixed with a mixer to obtain a photocurable resin composition used in Examples 1 to 27 and Comparative Examples 1 to 10. Numerical values in the tables indicate the number of parts by mass, and are the number of parts by mass based on solid content conversion. An equivalent number (eq) of the thermal curing agent indicates an equivalent number of the anionic group-containing photosensitive resin with respect to the carboxyl group amount.

2-1. Production of Dry film

The photocurable resin composition obtained above was applied onto a polyethylene terephthalate (PET) film having a thickness of 25 μm after drying and dried at 110° C. for 5 minutes, and then a polyethylene film was pasted on a coated surface side to obtain a dry film.

2-2. Evaluation of Development Resistance (1) Production of Test Piece

The polyethylene film of the dry film was peeled off, and pasted to a 25 μm thick polyimide film (full etching of Cu foil of "PKRW 1012RAH" manufactured by Arisawa Mfg. Co., Ltd.) by vacuum lamination to produce a test piece. The vacuum lamination was performed at a vacuum degree of 3 hPa, a hot plate temperature of 60° C., a pressing pressure of 0.5 MPa, and pressing time of 10 seconds.

(2) Measurement Method and Determination Criteria

An extra-high pressure mercury lamp irradiated the dry film with ultraviolet rays of 300 mJ/cm$^2$, then a PET film was peeled off, and development was performed by 1 wt % of an aqueous sodium carbonate solution at 30° C. for 90 seconds at a spray pressure of 0.18 MPa. The development resistance of the photocurable resin composition was evaluated according to the following determination criteria. "○" was pass, and "X" was not pass. The results are shown in Tables 1 to 4.

Determination Criteria

○ (good): No abnormality in photocurable resin composition

X (bad): Swelling and peeling off occur in photocurable resin composition 2-3. Evaluation of Solder Heat Resistance (Flux Resistance)

(1) Production of Test Piece

The polyethylene film of the dry film was peeled off and the dry film was pasted to a 35 μm thick electrolytic copper foil by vacuum lamination. The vacuum lamination was performed at a vacuum degree of 3 hPa, a hot plate temperature of 60° C., a pressing pressure of 0.5 MPa, and pressing time of 10 seconds. After the vacuum lamination, an extra-high pressure mercury lamp irradiated the dry film with ultraviolet rays of 300 mJ/cm$^2$. After irradiation, a PET film was peeled off, and development was performed with 1 wt % of an aqueous sodium carbonate solution at 30° C. for 60 seconds at a spray pressure of 0.18 MPa, After the development, a high pressure mercury lamp irradiated the dry film with the ultraviolet rays of 1,000 mJ/cm$^2$. After the irradiation, the dry film was cured at 150° C. for 90 minutes with a hot air circulating drier to produce the test piece.

(2) Measurement Method and Determination Criteria

Solder was fed into a solder bath, and a solder liquid set to 250° C. was prepared. A flux (lot number: WF-6317) manufactured by Senju Metal Industry Co., Ltd. was applied to a surface of the test piece on the photocurable resin composition layer side. After coating, the surface on the photocurable resin composition layer side was allowed to float on a solder bath for 10 seconds as described above. The test piece was taken out after 10 seconds, and it was visually confirmed whether the test piece had been swollen or peeled off. The test was performed once, and the test was repeated up to three times, and the heat resistance was evaluated according to the following determination criteria. "⊚" and "○" were pass, and "X" was not pass. The results are shown in Tables 1 to 4.

[Determination Criteria]
- ⊚ (Excellent): Test piece is not swollen or peeled off even if test is repeated three times
- ○ (good): Test piece is not swollen or peeled off even if test is repeated twice
- X (bad): Test piece is swollen or peeled off if test is less than twice 2-4. Evaluation of Bendability (1) Production of Test Piece A flexible copper-clad laminate ("PNS H1012RAH" manufactured by Arisawa Mfg. Co., Ltd.) provided with a straight circuit pattern having a thickness of 12 μM, a line width of 75 μm, and a space width of 70 μm was prepared on one side of a 25 μm thick polyimide base material. The polyethylene film of the dry film was peeled off and the dry film was pasted to the flexible copper-clad laminate by vacuum lamination. The vacuum lamination was performed at a vacuum degree of 3 hPa, a hot plate temperature of 60° C., a pressing pressure of 0.5 MPa, and pressing time of 10 seconds. After the vacuum lamination, an extra-high pressure mercury lamp irradiated the dry film with ultraviolet rays of 300 mJ/cm². After irradiation, a PET film was peeled off, and development was performed with 1 wt % of an aqueous sodium carbonate solution at 30° C. for 60 seconds at a spray pressure of 0.18 MPa. After the development, a high pressure mercury lamp irradiated the dry film with the ultraviolet rays of 1,000 mJ/cm². After irradiation, the dry film was cured at 150° C. for 90 minutes with a hot air circulating drier to produce the test piece.

(2) Measurement Method and Determination Criteria

The test piece was cut into 10 mm×100 mm, the test piece was bent 180° (seam folding) such that the photocurable resin composition layer became the outer side, and then 500 g of load was applied to the bent portion and held for 10 seconds. After 10 seconds, the test piece returned to 0°, and 500 g of load was applied to the bent portion to held for 10 seconds. The bent portion was observed with a digital microscope to confirm presence or absence of cracks on a surface of the dry film. The test was set as one cycle and confirmed up to five cycles, and the bendability was evaluated according to the following determination criteria. "○" and "Δ" were pass, and "X" was not pass. The results are shown in Tables 1 to 4.

Determination Criteria
- ○ (good): Cracking on the surface of the photocurable resin composition layer in three cycles or more and less than five cycles
- Δ (passable): Cracking on the surface of the photocurable resin composition layer in one cycle or more and less than three cycles
- X (bad): Cracking on the surface of the photocurable resin composition layer after one cycle 2-5. Evaluation of Tear-Off Strength (Adhesion)

(1) Production of Test Piece

The polyethylene film of the dry film was peeled off and the dry film was pasted to a 35 μm thick electrolytic copper foil by vacuum lamination. The vacuum lamination was performed at a vacuum degree of 3 hPa, a hot plate temperature of 60° C., a pressing pressure of 0.5 MPa, and pressing time of 10 seconds. After the vacuum lamination, an extra-high pressure mercury lamp irradiated the dry film with ultraviolet rays of 300 mJ/cm². After irradiation, a PET film was peeled off, and development was performed with 1 wt % of an aqueous sodium carbonate solution at 30° C. for 60 seconds at a spray pressure of 0.18 MPa, After the development, a high pressure mercury lamp irradiated the dry film with the ultraviolet rays of 1,000 mJ/cm². After the irradiation, the mixture was cured at 150° C. for 90 minutes with a hot air circulating drier. After curing, the test piece was produced by passing through a reflow furnace twice at a maximum temperature of 260° C.

(2) Measurement Method and Determination Criteria

In a test method in accordance with JPCA-BM02 electrolytic copper foil was teared off in a 180° direction to measure adhesion force between the photocurable resin composition layer and the electrolytic copper foil, and the adhesion was evaluated according to the following criteria. "○" was pass, and "X" was not pass. The results are shown in Tables 1 to 4.

Determination Criteria
- ○ (good): 10 N/cm or more and less than 15 N/cm
- X (bad): less than 10 N/cm 2-6. Evaluation of Flame Retardancy (1) Production of Test Piece The polyethylene film of the dry film was peeled off and pasted to both sides of a 25 μm thick polyimide film (full etching of Cu foil of "PKRW 1012RAH" manufactured by Arisawa Mfg. Co., Ltd.) by vacuum lamination. The vacuum lamination was performed at a vacuum degree of 3 hPa, a hot plate temperature of 60° C., a pressing pressure of 0.5 MPa, and pressing time of 10 seconds, After the vacuum lamination, an extra-high pressure mercury lamp irradiated the dry film with ultraviolet rays of 300 mJ/cm². After irradiation, a PET film was peeled off, and development was performed with 1 wt % of an aqueous sodium carbonate solution at 30° C. for 60 seconds at a spray pressure of 0.18 MPa. After the development, a high pressure mercury lamp irradiated the dry film with the ultraviolet rays of 1,000 mJ/cm². After irradiation, the dry film was cured at 150° C. for 90 minutes with a hot air circulating drier to produce the test piece.

(2) Measurement Method and Determination Criteria

Flame retardancy was evaluated by a test method in accordance with UL-94. "○" was pass, and "X" was not pass. The results are shown in Tables 1 to 4.

Determination Criteria
- ○ (good): Flame retardancy equivalent to VIM-0, which is a determination criterion of flame retardancy in accordance with UL-94 standard
- X (bad): Combustion 2-7. Evaluation of Solder Dam Formation (1) Production of Test Piece The polyethylene film of the dry film was peeled off, and pasted to a 25 μm thick polyimide film (full etching of Cu foil of "PKRW 1012RAH" manufactured by Arisawa Mfg. Co., Ltd.) by vacuum lamination to produce a test piece. The vacuum lamination was performed at a vacuum degree of 3 hPa, a hot plate temperature of 60° C., a pressing pressure of 0.5 MPa, and pressing time of 10 seconds.

(2) Measurement Method and Determination Criteria

The extra-high pressure mercury lamp irradiated the dry film with the ultraviolet rays of 300 mJ/cm² via a photomask on which a predetermined pattern (L/S=50/300 μm, 60/300 μm, 70/300 μm, 80/300 μm, 90/300 μm, 100/300 μm, 110/300 μm, 120/300 μm, 130/300 μm, 140/300 μm, 150/300 μm) was formed. After the irradiation, the PET film was peeled off, 1 wt % of an aqueous sodium carbonate solution was sprayed onto the dry film at a spray pressure of 0.18 MPa at 30° C., and developed for 60 seconds. Solder dam formation was evaluated by the following criteria. "○" and "Δ" were pass, and "X" was not pass.

Evaluation Criteria

Solder dam formability was determined by presence or absence of peeling and fluctuation of a line.

○ (good): Formation of a line of 100 μm or less is possible (no abnormality in the line)

Δ (passable): Formation of a line of 100 μm to 150 μm is possible (no abnormality in the line)

X (bad): Formation of a line of 150 μm is impossible (peeling and fluctuation occur in the line)

In Examples 1 to 23, 25, and 27 and Comparative Examples 1 to 10, evaluation of solder dam formation was ○ (good), and evaluation in Example 24 and Example 26 was Δ (passable). From these results, it can be said that the dry film produced from the photocurable resin composition sufficiently satisfies various characteristics required for a photosensitive film, a solder resist film, or the like.

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| composition | Photosensitive urethane resin (A) | 100 | 100 | 100 | 80 | 60 | 40 | 80 | 60 | 40 |
| | Photosensitive urethane resin (B) | — | — | — | 20 | 40 | 60 | — | — | — |
| | Photosensitive urethane resin (C) | — | — | — | — | — | — | 20 | 40 | 60 |
| | Photosensitive urethane resin (D) | — | — | — | — | — | — | — | — | — |
| | Photosensitive urethane resin (E) | — | — | — | — | — | — | — | — | — |
| | Photosensitive urethane resin (F) | — | — | — | — | — | — | — | — | — |
| | Photosensitive urethane resin (G) | — | — | — | — | — | — | — | — | — |
| | Photosensitive urethane resin (H) | — | — | — | — | — | — | — | — | — |
| | Photosensitive urethane resin (I) | — | — | — | — | — | — | — | — | — |
| | Photosensitive urethane resin (J) | — | — | — | — | — | — | — | — | — |
| | Photosensitive urethane resin (K) | — | — | — | — | — | — | — | — | — |
| | Photosensitive urethane resin (L) | — | — | — | — | — | — | — | — | — |
| | Photosensitive urethane resin (M) | — | — | — | — | — | — | — | — | — |
| | Photosensitive urethane resin (N) | — | — | — | — | — | — | — | — | — |
| | Photosensitive urethane resin (O) | — | — | — | — | — | — | — | — | — |
| | Acid-modified epoxy acrylate (P) | — | — | — | — | — | — | — | — | — |
| | Acrylic acrylate containing acid group (Q) | — | — | — | — | — | — | — | — | — |
| | Modified epoxy acrylate (R) | 40 | 40 | 40 | 40 | 40 | 40 | 40 | 40 | 40 |
| | Photopolymerization initiator (S) | 10 | 10 | 10 | 10 | 10 | 10 | 10 | 10 | 10 |
| | Thermal curing agent (T) | 1eq | 1eq | — | 1eq | 1eq | 1eq | 1eq | 1eq | 1eq |
| | Thermal curing agent (U) | — | — | 1eq | — | — | — | — | — | — |
| | Flame retardant (V) | 40 | 40 | 40 | 40 | 40 | 40 | 40 | 40 | 40 |
| | Colorant (W) | — | 1 | — | — | — | — | — | — | — |
| | Colorant (X) | — | — | — | — | — | — | — | — | — |
| | Amount of unsaturated bonds in main chain of compound A [mmol/g] | 2.20 | 2.20 | 2.20 | 1.76 | 1.32 | 0.88 | 1.76 | 1.32 | 0.88 |
| | Amount of unsaturated bonds in main chain of photosensitive urethane resin [mmol/g] | 1.05 | 1.05 | 1.05 | 0.84 | 0.63 | 0.42 | 0.84 | 0.63 | 0.42 |
| | Amount of unsaturated bonding group in side chain in the whole photosensitive resin containing anionic group [mmol/g] | 0.51 | 0.51 | 0.51 | 0.50 | 0.50 | 0.50 | 0.50 | 0.50 | 0.50 |
| | Carboxyl group content of anionic group-containing photosensitive resin [mmol/g] | 0.89 | 0.89 | 0.89 | 0.88 | 0.88 | 0.87 | 0.88 | 0.88 | 0.88 |

TABLE 1-continued

|  |  | Example 1 | Example 2 | Example 3 | Example 4 | Example 5 | Example 6 | Example 7 | Example 8 | Example 9 |
|---|---|---|---|---|---|---|---|---|---|---|
| Evaluation | Acid value of photosensitive urethane resin [mgKOH/g] | 50 | 50 | 50 | 50 | 50 | 50 | 50 | 50 | 50 |
|  | cid value of anionic group-containing photosensitive resin [mgKOH/g] | 50 | 50 | 50 | 50 | 50 | 50 | 50 | 50 | 50 |
|  | Development resistance | ○ | ○ | ○ | ○ | ○ | ○ | ○ | ○ | ○ |
|  | Bendability at 180° (Hemming) | ○ | ○ | ○ | ○ | ○ | ○ | ○ | ○ | ○ |
|  | Solder heat resistance (flux resistance) | ◎ | ◎ | ◎ | ◎ | ○ | ○ | ◎ | ○ | ○ |
|  | Adhesion (peel, 180° Cu pull) | ○ | ○ | ○ | ○ | ○ | ○ | ○ | ○ | ○ |
|  | Flame retardant (VTM-0) | ○ | ○ | ○ | ○ | ○ | ○ | ○ | ○ | ○ |

TABLE 2

|  |  | Example 10 | Example 11 | Example 12 | Example 13 | Example 14 | Example 15 | Example 16 | Example 17 | Example 18 |
|---|---|---|---|---|---|---|---|---|---|---|
| composition | Photosensitive urethane resin (A) | — | 70 | — | — | — | — | — | — | — |
|  | Photosensitive urethane resin (B) | — | — | — | — | — | — | — | — | — |
|  | Photosensitive urethane resin (C) | — | — | — | — | — | — | — | — | — |
|  | Photosensitive urethane resin (D) | 100 | — | — | — | — | — | — | — | — |
|  | Photosensitive urethane resin (E) | — | 30 | — | — | — | — | — | — | — |
|  | Photosensitive urethane resin (F) | — | — | 100 | — | — | — | — | — | — |
|  | Photosensitive urethane resin (G) | — | — | — | 100 | — | — | — | — | — |
|  | Photosensitive urethane resin (H) | — | — | — | — | 100 | — | — | — | — |
|  | Photosensitive urethane resin (I) | — | — | — | — | — | 100 | — | — | — |
|  | Photosensitive urethane resin (J) | — | — | — | — | — | — | 100 | — | — |
|  | Photosensitive urethane resin (K) | — | — | — | — | — | — | — | 100 | — |
|  | Photosensitive urethane resin (L) | — | — | — | — | — | — | — | — | 100 |
|  | Photosensitive urethane resin (M) | — | — | — | — | — | — | — | — | — |
|  | Photosensitive urethane resin (N) | — | — | — | — | — | — | — | — | — |
|  | Photosensitive urethane resin (O) | — | — | — | — | — | — | — | — | — |
|  | Acid-modified epoxy acrylate (P) | — | — | — | — | — | — | — | — | — |
|  | Acrylic acrylate containing acid group (Q) | — | — | — | — | — | — | — | — | — |
|  | Modified epoxy acrylate (R) | 40 | 40 | 40 | 40 | 40 | 40 | 40 | 40 | 40 |
|  | Photopolymerization initiator (S) | 10 | 10 | 10 | 10 | 10 | 10 | 10 | 10 | 10 |
|  | Thermal curing agent (T) | 1eq | 1eq | 1eq | 1eq | 1eq | 1eq | 1eq | 1eq | 1eq |
|  | Thermal curing agent (U) | — | — | — | — | — | — | — | — | — |
|  | Flame retardant (V) | 40 | 40 | 40 | 40 | 40 | 40 | 40 | 40 | 40 |
|  | Colorant (W) | — | — | — | — | — | — | — | — | — |
|  | Colorant (X) | — | — | — | — | — | — | — | — | — |
|  | Amount of unsaturated bonds in main chain of compound A [mmol/g] | 2.20 | 2.20 | 1.76 | 1.32 | 0.88 | 1.74 | 1.29 | 1.06 | 2.20 |
|  | Amount of unsaturated bonds in main chain of photosensitive urethane resin [mmol/g] | 1.06 | 1.05 | 0.85 | 0.64 | 0.43 | 0.84 | 0.63 | 0.42 | 1.06 |

TABLE 2-continued

|  |  | Example 10 | Example 11 | Example 12 | Example 13 | Example 14 | Example 15 | Example 16 | Example 17 | Example 18 |
|---|---|---|---|---|---|---|---|---|---|---|
|  | Amount of unsaturated bonding group in side chain in the whole photosensitive resin containing anionic group [mmol/g] | 0.13 | 0.75 | 0.50 | 0.50 | 0.50 | 0.51 | 0.52 | 0.52 | 0.74 |
|  | Carboxyl group content of anionic group-containing photosensitive resin [mmol/g] | 1.27 | 0.64 | 0.88 | 0.88 | 0.87 | 0.88 | 0.88 | 0.88 | 0.64 |
|  | Acid value of photosensitive urethane resin [mgKOH/g] | 72 | 36 | 50 | 50 | 50 | 50 | 50 | 50 | 36 |
|  | cid value of anionic group-containing photosensitive resin [mgKOH/g] | 72 | 36 | 50 | 50 | 50 | 50 | 50 | 50 | 36 |
| Evaluation | Development resistance | ○ | ○ | ○ | ○ | ○ | ○ | ○ | ○ | ○ |
|  | Bendability at 180° (Hemming) | ○ | ○ | ○ | ○ | ○ | ○ | ○ | ○ | ○ |
|  | Solder heat resistance (flux resistance) | ◎ | ○ | ◎ | ○ | ○ | ◎ | ○ | ○ | ○ |
|  | Adhesion (peel, 180° Cu pull) | ○ | ○ | ○ | ○ | ○ | ○ | ○ | ○ | ○ |
|  | Flame retardant (VTM-0) | ○ | ○ | ○ | ○ | ○ | ○ | ○ | ○ | ○ |

TABLE 3

|  |  | Example 19 | Example 20 | Example 21 | Example 22 | Example 23 | Example 24 | Example 25 | Example 26 | Example 27 |
|---|---|---|---|---|---|---|---|---|---|---|
| composition | Photosensitive urethane resin (A) | 85 | 80 | 75 | 90 | 85 | 90 | 70 | 95 | 80 |
|  | Photosensitive urethane resin (B) | — | — | — | — | — | — | — | — | — |
|  | Photosensitive urethane resin (C) | — | — | — | — | — | — | — | — | — |
|  | Photosensitive urethane resin (D) | — | — | — | — | — | — | — | — | — |
|  | Photosensitive urethane resin (E) | — | — | — | — | — | — | — | — | — |
|  | Photosensitive urethane resin (F) | — | — | — | — | — | — | — | — | — |
|  | Photosensitive urethane resin (G) | — | — | — | — | — | — | — | — | — |
|  | Photosensitive urethane resin (H) | — | — | — | — | — | — | — | — | — |
|  | Photosensitive urethane resin (I) | — | — | — | — | — | — | — | — | — |
|  | Photosensitive urethane resin (J) | — | — | — | — | — | — | — | — | — |
|  | Photosensitive urethane resin (K) | — | — | — | — | — | — | — | — | — |
|  | Photosensitive urethane resin (L) | — | — | — | — | — | — | — | — | — |
|  | Photosensitive urethane resin (M) | — | — | — | — | — | — | — | — | — |
|  | Photosensitive urethane resin (N) | — | — | — | — | — | — | — | — | — |
|  | Photosensitive urethane resin (O) | — | — | — | — | — | — | — | — | — |
|  | Acid-modified epoxy acrylate (P) | 15 | 20 | 25 | — | — | 10 | 30 | — | — |
|  | Acrylic acrylate containing acid group (Q) | — | — | — | 10 | 15 | — | — | 5 | 20 |
|  | Modified epoxy acrylate (R) | 40 | 40 | 40 | 40 | 40 | 40 | 40 | 40 | 40 |
|  | Photopolymerization initiator (S) | 10 | 10 | 10 | 10 | 10 | 10 | 10 | 10 | 10 |
|  | Thermal curing agent (T) | 1eq | 1eq | 1eq | 1eq | 1eq | 1eq | 1eq | 1eq | 1eq |
|  | Thermal curing agent (U) | — | — | — | — | — | — | — | — | — |

TABLE 3-continued

|  |  | Example 19 | Example 20 | Example 21 | Example 22 | Example 23 | Example 24 | Example 25 | Example 26 | Example 27 |
|---|---|---|---|---|---|---|---|---|---|---|
|  | Flame retardant (V) | 40 | 40 | 40 | 40 | 40 | 40 | 40 | 40 | 40 |
|  | Colorant (W) | — | — | — | — | — | — | — | — | — |
|  | Colorant (X) | 6 | 6 | 6 | 6 | 6 | 6 | 6 | 6 | 6 |
|  | Amount of unsaturated bonds in main chain of compound A [mmol/g] | 1.87 | 1.76 | 1.65 | 1.98 | 1.87 | 1.98 | 1.54 | 2.09 | 1.76 |
|  | Amount of unsaturated bonds in main chain of photosensitive urethane resin [mmol/g] | 0.89 | 0.84 | 0.79 | 0.95 | 0.89 | 0.95 | 0.74 | 1.00 | 0.84 |
|  | Amount of unsaturated bonding group in side chain in the whole photosensitive resin containing anionic group [mmol/g] | 0.73 | 0.80 | 0.88 | 0.72 | 0.82 | 0.66 | 0.95 | 0.61 | 0.93 |
|  | Carboxyl group content of anionic group-containing photosensitive resin [mmol/g] | 1.02 | 1.06 | 1.11 | 0.92 | 0.94 | 0.98 | 1.15 | 0.91 | 0.96 |
|  | Acid value of photosensitive urethane resin [mgKOH/g] | 43 | 40 | 38 | 45 | 43 | 45 | 35 | 48 | 40 |
|  | cid value of anionic group-containing photosensitive resin [mgKOH/g] | 57 | 60 | 62 | 55 | 57 | 55 | 64 | 52 | 60 |
| Evaluation | Development resistance | ○ | ○ | ○ | ○ | ○ | ○ | ○ | ○ | ○ |
|  | Bendability at 180° (Hemming) | ○ | ○ | ○ | ○ | ○ | ○ | Δ | ○ | Δ |
|  | Solder heat resistance (flux resistance) | ○ | ○ | ○ | ○ | ○ | ○ | ○ | ○ | ○ |
|  | Adhesion (peel, 180° Cu pull) | ○ | ○ | ○ | ○ | ○ | ○ | ○ | ○ | ○ |
|  | Flame retardant (VTM-0) | ○ | ○ | ○ | ○ | ○ | ○ | ○ | ○ | ○ |

TABLE 4

|  |  | Comparative Example 1 | Comparative Example 2 | Comparative Example 3 | Comparative Example 4 | Comparative Example 5 |
|---|---|---|---|---|---|---|
| Composition | Photosensitive urethane resin (A) | 30 | 30 | — | 60 | — |
|  | Photosensitive urethane resin (B) | 70 | — | 100 | — | — |
|  | Photosensitive urethane resin (C) | — | 70 | — | — | 100 |
|  | Photosensitive urethane resin (D) | — | — | — | — | — |
|  | Photosensitive urethane resin (E) | — | — | — | 40 | — |
|  | Photosensitive urethane resin (F) | — | — | — | — | — |
|  | Photosensitive urethane resin (G) | — | — | — | — | — |
|  | Photosensitive urethane resin (H) | — | — | — | — | — |
|  | Photosensitive urethane resin (I) | — | — | — | — | — |
|  | Photosensitive urethane resin (J) | — | — | — | — | — |
|  | Photosensitive urethane resin (K) | — | — | — | — | — |
|  | Photosensitive urethane resin (L) | — | — | — | — | — |
|  | Photosensitive urethane resin (M) | — | — | — | — | — |
|  | Photosensitive urethane resin (N) | — | — | — | — | — |
|  | Photosensitive urethane resin (O) | — | — | — | — | — |
|  | Acid-modified epoxy acrylate (P) | — | — | — | — | — |

TABLE 4-continued

|  |  |  |  |  |  |  |
|---|---|---|---|---|---|---|
|  | Acrylic acrylate containing acid group (Q) | — | — | — | — | — |
|  | Modified epoxy acrylate (R) | 40 | 40 | 40 | 40 | 40 |
|  | Photopolymerization initiator (S) | 10 | 10 | 10 | 10 | 10 |
|  | Thermal curing agent (T) | 1eq | 1eq | 1eq | 1eq | 1eq |
|  | Thermal curing agent (U) | — | — | — | — | — |
|  | Flame retardant (V) | 40 | 40 | 40 | 40 | 40 |
|  | Colorant (W) | — | — | — | — | — |
|  | Colorant (X) | — | — | — | — | — |
|  | Amount of unsaturated bonds in main chain of compound A [mmol/g] | 0.66 | 0.66 | 0.00 | 2.20 | 0.00 |
|  | Amount of unsaturated bonds in main chain of photosensitive urethane resin [mmol/g] | 0.32 | 0.32 | 0.00 | 1.05 | 0.00 |
|  | Amount of unsaturated bonding group in side chain in the whole photosensitive resin containing anionic group [mmol/g] | 0.50 | 0.50 | 0.49 | 0.83 | 0.50 |
|  | Carboxyl group content of anionic group-containing photosensitive resin [mmol/g] | 0.87 | 0.87 | 0.80 | 0.56 | 0.87 |
|  | Acid value of photosensitive urethane resin [mgKOH/g] | 50 | 50 | 50 | 32 | 50 |
|  | cid value of anionic group-containing photosensitive resin [mgKOH/g] | 50 | 50 | 50 | 32 | 50 |
| Evaluation | Development resistance | X | X | X | ○ | X |
|  | Bendability at 180° (Hemming) | Δ | ○ | Δ | ○ | ○ |
|  | Solder heat resistance (flux resistance) | X | X | X | X | X |
|  | Adhesion (peel, 180° Cu pull) | ◎ | ◎ | ◎ | ◎ | ◎ |
|  | Flame retardant (VTM-0) | ◎ | ◎ | ◎ | ◎ | ◎ |

|  |  | Comparative Example 6 | Comparative Example 7 | Comparative Example 8 | Comparative Example 9 | Comparative Example 10 |
|---|---|---|---|---|---|---|
| Composition | Photosensitive urethane resin (A) | — | — | — | — | — |
|  | Photosensitive urethane resin (B) | — | — | — | — | — |
|  | Photosensitive urethane resin (C) | — | — | — | — | — |
|  | Photosensitive urethane resin (D) | — | — | — | — | — |
|  | Photosensitive urethane resin (E) | — | — | — | — | — |
|  | Photosensitive urethane resin (F) | — | — | — | — | — |
|  | Photosensitive urethane resin (G) | — | — | — | — | — |
|  | Photosensitive urethane resin (H) | — | — | — | — | — |
|  | Photosensitive urethane resin (I) | — | — | — | — | — |
|  | Photosensitive urethane resin (J) | — | — | — | — | — |
|  | Photosensitive urethane resin (K) | — | — | — | — | — |
|  | Photosensitive urethane resin (L) | — | — | — | — | — |
|  | Photosensitive urethane resin (M) | 100 | — | — | — | — |
|  | Photosensitive urethane resin (N) | — | 100 | — | — | — |
|  | Photosensitive urethane resin (O) | — | — | 100 | — | — |

TABLE 4-continued

|  | | | | | | |
|---|---|---|---|---|---|---|
| | Acid-modified epoxy acrylate (P) | — | — | — | 100 | — |
| | Acrylic acrylate containing acid group (Q) | — | — | — | — | 100 |
| | Modified epoxy acrylate (R) | 40 | 40 | 40 | 40 | 40 |
| | Photopolymerization initiator (S) | 10 | 10 | 10 | 10 | 10 |
| | Thermal curing agent (T) | 1eq | 1eq | 1eq | 1eq | 1eq |
| | Thermal curing agent (U) | — | — | — | — | — |
| | Flame retardant (V) | 40 | 40 | 40 | 40 | 40 |
| | Colorant (W) | — | — | — | — | — |
| | Colorant (X) | — | — | — | — | — |
| | Amount of unsaturated bonds in main chain of compound A [mmol/g] | 0.66 | 0.63 | 2.20 | 0.00 | 0.00 |
| | Amount of unsaturated bonds in main chain of photosensitive urethane resin [mmol/g] | 0.32 | 0.32 | 1.05 | 0.00 | 0.00 |
| | Amount of unsaturated bonding group in side chain in the whole photosensitive resin containing anionic group [mmol/g] | 0.50 | 0.48 | 0.81 | 2.00 | 2.63 |
| | Carboxyl group content of anionic group-containing photosensitive resin [mmol/g] | 0.87 | 0.87 | 0.56 | 1.75 | 1.23 |
| | Acid value of photosensitive urethane resin mgKOH/g] | 50 | 50 | 32 | — | — |
| | cid value of anionic group-containing photosensitive resin [mgKOH/g] | 50 | 50 | 32 | 98 | 69 |
| Evaluation | Development resistance | X | X | ○ | ○ | ○ |
| | Bendability at 180° (Hemming) | Δ | ○ | ○ | X | X |
| | Solder heat resistance (flux resistance) | X | X | X | ◎ | ◎ |
| | Adhesion (peel, 180° Cu pull) | ◎ | ◎ | ◎ | ◎ | ◎ |
| | Flame retardant (VTM-0) | ◎ | ◎ | ◎ | ◎ | ◎ |

Details of the components used in the above examples are as follows.

Photosensitive urethane resin (A): A photosensitive urethane resin (1) containing an ester bond and an unsaturated bond in the main chain, an acid value of 50 mg KOH/g, a carboxyl group amount of 0.89 mmol/g Photosensitive urethane resin (B): A photosensitive urethane resin containing a carbonate bond and no unsaturated bond in the main chain, an acid value of 50 mg KOH/g, a carboxyl group amount of 0.86 mmol/g Photosensitive urethane resin (C): A photosensitive urethane resin containing an ester bond and no unsaturated bond in the main chain, an acid value of 50 mg KOH/g, a carboxyl group amount of 0.87 mmol/g Photosensitive urethane resin (D): A photosensitive urethane resin (2) containing an ester bond and an unsaturated bond in the main chain, an acid value of 72 mg KOH/g, a carboxyl group amount of 1.27 mmol/g Photosensitive urethane resin (E): A photosensitive urethane resin (3) containing an ester bond and an unsaturated bond in the main chain, an acid value of 4 mg KOH/g, a carboxyl group amount of 0.06 mmol/g Photosensitive urethane resin (F): A photosensitive urethane resin (1) containing an ester bond, an unsaturated bond, and a carbonate bond in the main chain, an acid value of 50 mg KOH/g, a carboxyl group amount of 0.88 mmol/g Photosensitive urethane resin (G): A photosensitive urethane resin (2) containing an ester bond, an unsaturated bond, and a carbonate bond in the main chain, an acid value of 50 mg KOH/g, a carboxyl group amount of 0.88 mmol/g Photosensitive urethane resin (H): A photosensitive urethane resin (3) containing an ester bond, an unsaturated bond, and a carbonate bond in the main chain, an acid value of 50 mg KOH/g, a carboxyl group amount of 0.87 mmol/g, Photosensitive urethane resin (I): A photosensitive urethane resin (4) containing an ester bond and an unsaturated bond in the main chain, an acid value of 50 mg KOH/g, a carboxyl group amount of 0.88 mmol/g Photosensitive urethane resin (J): A photosensitive urethane resin (5) containing an ester bond and an unsaturated bond in the main chain, an acid value of 50 mg KOH/g, a carboxyl group amount of 0.88 mmol/g Photosensitive urethane resin (K): A photosensitive urethane resin (6) containing an ester bond and an unsaturated bond in the main chain, an acid value of 50 mg KOH/g, a carboxyl group amount of 0.88 mmol/g Photosensitive urethane resin (L): A photosensitive urethane resin (7) containing an ester bond and an unsaturated bond in the main chain, an acid value of 36 mg KOH/g, a carboxyl group amount of 0.64 mmol/g Photosensitive urethane resin (M): A photosensitive urethane resin (4) containing an ester bond, an unsaturated bond, and a carbonate bond in the main chain, an acid value of 50 mg KOH/g, a carboxyl group amount of 0.87 mmol/g Photosensitive urethane resin (N): A photosensitive urethane resin (8) containing an ester bond and an unsaturated bond in the main chain, an acid value of 50 mg KOH/g, a carboxyl group amount of 0.87 mmol/g Photosensitive urethane resin (0): A photosensitive urethane resin (9) containing an ester bond and an unsaturated bond in the main chain, an acid value of 32 mg KOH/g, a carboxyl group amount of 0.56 mmol/g Acid-modified epoxy acrylate (P): "ZFR-1491H" (trade name) manufactured by Nippon Kayaku Co., Ltd, a carboxylic acid-modified bisphenol F type epoxy acrylate, Mw=11,000, an acid value of 98 mg KOH/g Acid group-containing acrylic acrylate (Q): "(ACA)-Z250" (trade name) manufactured by DAICEL-ALLNEX LTD., an acid-containing acrylic acrylate, Mw=22,000, an acid value of 69 mg KOH/g Modified epoxy acrylate (R): "EBECRY-3708" (trade name) manufactured by DAICEL-ALLNEX LTD., Mw=1,500, bifunctional Photopolymerization initiator (S): 2,4,6-trimethyl benzoyl di phenyl phosphine oxide Thermal curing agent (T): A bisphenol A type epoxy resin, an epoxy equivalent of 475 g/eq Thermal curing agent (U): A phenol novolac type epoxy resin, an epoxy equivalent of 177 g/eq Flame retardant (V): A phosphinic acid metal salt Colorant (W): Isoindoline (yellow pigment)

Colorant (X): Perylene black (FK-4280)

From the results of Tables 1 to 4, it was found that Examples 1 to 27 had excellent adhesion and excellent bendability and heat resistance. On the other hand, in Comparative Examples 1 to 10, these cannot coexist, and development resistance was poor.

Although the present invention has been described in detail with reference to specific embodiments, it will be apparent to those skilled in the art that various changes and modifications can be made without departing from the spirit and scope of the present invention. This application is based on Japanese Patent Application 2018-012084 filed on Jan. 26, 2018, Japanese Patent Application 2018-025451 filed on Feb. 15, 2018, and Japanese Patent Application 2018-186846 filed on Oct. 1, 2018, contents of which are incorporated by reference herein.

INDUSTRIAL APPLICABILITY

The cured film formed from the photocurable resin composition of the present invention has adhesion and excellent bendability and heat resistance, and can be suitably used for electronic material components, in particular, a negative resist of a circuit board (including pigment dispersion ink or the like for a color filter), a photosensitive film (dry film resist, photosensitive cover lay film), a solder resist film, a base film, or the like.

What is claimed is:

1. A photocurable resin composition containing:
an anionic group-containing photosensitive resin containing at least a photosensitive urethane resin;
a photopolymerization initiator; and
a thermal curing agent,
wherein the photosensitive urethane resin is obtained by reacting a raw material mixture containing the following compounds (A) to (D):
(A) a polyol having at least an ester bond and at least an unsaturated bond in the main chain;
(B) a compound having both at least one active hydrogen-containing group and at least one anionic group in the molecule;
(C) polyisocyanate; and
(D) a compound having both at least one active hydrogen-containing group and an unsaturated bond group in the molecule, and
the photosensitive urethane resin has:
the ester bond and the unsaturated bond in the main chain in the same molecule, an amount of the unsaturated bond in the main chain of the compound (A) being 0.80 mmol/g or more;
an anionic group in at least one of side chains and ends, an amount of the anionic group contained in the anionic group-containing photosensitive resin being 0.60 mmol/g or more; and
the unsaturated bond group in the side chains.

2. The photocurable resin composition according to claim 1,
wherein an amount of the unsaturated bond in the side chain of the anionic group-containing photosensitive resin is 0.70 to 0.90 mmol/g.

3. The photocurable resin composition according to claim 1,
wherein the amount of the anionic group contained in the anionic group-containing photosensitive resin is 0.60 to 1.50 mmol/g.

4. The photocurable resin composition according to claim 1,
wherein an amount of the unsaturated bond in the main chain contained in the photosensitive urethane resin is 0.40 to 2.20 mmol/g.

5. The photocurable resin composition according to claim 1,
wherein the anionic group contained in the compound (B) is a carboxyl group.

6. The photocurable resin composition according to claim 5,
wherein an amount of the carboxyl group contained in the photosensitive urethane resin is 0.60 to 1.50 mmol/g.

7. The photocurable resin composition according to claim 1,
wherein the photosensitive urethane resin has an acid value of 33 to 85 mg KOH/g.

8. The photocurable resin composition according to claim 1,
wherein the compound (A) is a polyol obtained by reacting at least (a) at least one of an unsaturated dibasic acid and a derivative thereof with (c) a polyhydric alcohol.

9. The photocurable resin composition according to claim 8,
wherein the compound (A) is a polyol obtained by reacting further (b) at least one of a saturated dibasic acid and a derivative thereof.

10. The photocurable resin composition according to claim 1, wherein the compound (B) is at least one compound selected from the group consisting of dimethylol butanoic acid and dimethylol propanoic acid.

11. The photocurable resin composition according to claim 1, wherein the compound (D) is at least one compound selected from the group consisting of glycerin monoallyl ether, glycerin monoacrylate, and glycerin monomethacrylate.

12. The photocurable resin composition according to claim 1, wherein the photosensitive urethane resin is obtained by reacting an isocyanate group (Y) of the compound (C) with total active hydrogen (X) of sum of compounds other than the compound (C) at an equivalent ratio X/Y=0.7 to 1.1.

13. A cured film formed from the photocurable resin composition according to claim 1.

14. An adhesive sheet formed from the photocurable resin composition according to claim 1.

15. A photosensitive film formed from the photocurable resin composition according to claim 1.

16. A printed wiring board in which the photosensitive film according to claim 15 is provided on a wiring pattern made of a conductive material.

17. An image display device including the cured film according to claim 13.

\* \* \* \* \*